(12) United States Patent
Pagaila et al.

(10) Patent No.: US 9,337,116 B2
(45) Date of Patent: May 10, 2016

(54) SEMICONDUCTOR DEVICE AND METHOD OF FORMING STEPPED INTERPOSER FOR STACKING AND ELECTRICALLY CONNECTING SEMICONDUCTOR DIE

(75) Inventors: Reza A. Pagaila, Singapore (SG); Yaojian Lin, Singapore (SG); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 485 days.

(21) Appl. No.: 12/914,878

(22) Filed: Oct. 28, 2010

(65) Prior Publication Data
US 2012/0104623 A1 May 3, 2012

(51) Int. Cl.
*H01L 23/48* (2006.01)
*H01L 23/52* (2006.01)
(Continued)

(52) U.S. Cl.
CPC ............ *H01L 23/3128* (2013.01); *H01L 23/13* (2013.01); *H01L 24/97* (2013.01); *H01L 25/0657* (2013.01); *H01L 21/561* (2013.01); *H01L 23/49827* (2013.01); *H01L 25/03* (2013.01); *H01L 25/105* (2013.01); *H01L 2224/16225* (2013.01); *H01L 2224/16227* (2013.01); *H01L 2224/48091* (2013.01); *H01L 2224/73265* (2013.01); *H01L 2224/97* (2013.01); *H01L 2225/06517* (2013.01); *H01L 2225/06548* (2013.01); *H01L 2225/06568* (2013.01); *H01L 2924/014* (2013.01); *H01L 2924/01029* (2013.01); *H01L 2924/01047* (2013.01);

(Continued)

(58) Field of Classification Search
CPC . H01L 23/3128; H01L 25/0657; H01L 23/13; H01L 24/97; H01L 2924/18162; H01L 21/8221; H01L 25/043; H01L 25/0756; H01L 27/3209
USPC ......... 257/777, 778, 686, 723, 678, 737, 738, 257/776, 781, 782, 783, 784, 786, 734, 751, 257/690, 692, 693; 438/108, 109, 110; 361/761
See application file for complete search history.

(56) References Cited

U.S. PATENT DOCUMENTS 4,376,287 A * 3/1983 Sechi ..................... H01L 23/15 257/664
4,670,770 A * 6/1987 Tai ........................ H01L 23/147 216/13

(Continued)

FOREIGN PATENT DOCUMENTS

JP 2001274324 A 10/2001
KR 1020050117715 12/2005

*Primary Examiner* — Thanh Y Tran
(74) *Attorney, Agent, or Firm* — Robert D. Atkins; Atkins and Associates, P.C.

(57) ABSTRACT

A semiconductor substrate has a plurality of different size recesses formed in the substrate to provide a stepped interposer. A conductive via can be formed through the stepped interposer. An insulating layer follows a contour of the stepped interposer. A conductive layer is formed over the insulating layer following the contour of the stepped interposer. A first semiconductor die is partially disposed in a first recess and electrically connected to the conductive layer. A second semiconductor die is partially disposed in a second recess and electrically connected to the conductive layer. The first semiconductor die is electrically connected to the second semiconductor die through the conductive layer. The first and second semiconductor die can be flipchip type semiconductor die. An encapsulant is deposited over the first and second semiconductor die. A portion of the stepped interposer can be removed to reduce thickness.

38 Claims, 22 Drawing Sheets

(51) Int. Cl.
  H01L 29/40 (2006.01)
  H01L 23/31 (2006.01)
  H01L 23/13 (2006.01)
  H01L 23/00 (2006.01)
  H01L 25/065 (2006.01)
  H01L 21/56 (2006.01)
  H01L 23/498 (2006.01)
  H01L 25/03 (2006.01)
  H01L 25/10 (2006.01)

(52) U.S. Cl.
  CPC ............... *H01L2924/01073* (2013.01); *H01L 2924/01074* (2013.01); *H01L 2924/01079* (2013.01); *H01L 2924/01322* (2013.01); *H01L 2924/12041* (2013.01); *H01L 2924/1306* (2013.01); *H01L 2924/13091* (2013.01); *H01L 2924/1515* (2013.01); *H01L 2924/15311* (2013.01); *H01L 2924/15321* (2013.01); *H01L 2924/15331* (2013.01); *H01L 2924/181* (2013.01); *H01L 2924/18161* (2013.01)

(56) References Cited

U.S. PATENT DOCUMENTS

| | | | |
|---|---|---|---|
| 5,103,283 A * | 4/1992 | Hite ............................... 257/724 |
| 5,907,151 A * | 5/1999 | Gramann et al. .......... 250/214.1 |
| 6,787,916 B2 | 9/2004 | Halahan |
| 6,861,363 B2 | 3/2005 | Harchanko et al. |
| 7,217,994 B2 | 5/2007 | Zhu et al. |
| 7,489,025 B2 | 2/2009 | Chen et al. |
| 7,491,567 B2 | 2/2009 | DCamp et al. |
| 7,833,840 B2 * | 11/2010 | Ahn et al. ..................... 438/123 |
| 7,948,092 B2 * | 5/2011 | Murayama et al. ........... 257/783 |
| 8,119,447 B2 | 2/2012 | Pagaila et al. |
| 2001/0040279 A1 * | 11/2001 | Mess et al. ..................... 257/678 |
| 2002/0053727 A1 * | 5/2002 | Kimura .......................... 257/686 |
| 2003/0164543 A1 * | 9/2003 | Kheng Lee ................... 257/706 |
| 2003/0230801 A1 * | 12/2003 | Jiang et al. .................... 257/723 |
| 2004/0178510 A1 * | 9/2004 | Sunohara et al. ............. 257/781 |
| 2004/0207058 A1 * | 10/2004 | Sohn .............................. 257/678 |
| 2005/0067715 A1 * | 3/2005 | Sunohara ....................... 257/778 |
| 2005/0258548 A1 * | 11/2005 | Ogawa et al. ................. 257/778 |
| 2006/0145359 A1 * | 7/2006 | Sunohara et al. ............. 257/778 |
| 2007/0013048 A1 * | 1/2007 | Sunohara et al. ............. 257/698 |
| 2007/0235215 A1 | 10/2007 | Bathan et al. |
| 2008/0128882 A1 | 6/2008 | Baek et al. |
| 2008/0136002 A1 * | 6/2008 | Yang ............................. 257/686 |
| 2009/0032928 A1 | 2/2009 | Chiang et al. |
| 2009/0039527 A1 | 2/2009 | Chan et al. |
| 2009/0065919 A1 | 3/2009 | Jang et al. |
| 2009/0065920 A1 * | 3/2009 | Ahn et al. ..................... 257/686 |
| 2009/0294027 A1 * | 12/2009 | Wang ............................ 156/150 |
| 2010/0019368 A1 * | 1/2010 | Shin ............................... 257/686 |
| 2010/0072588 A1 * | 3/2010 | Yang ............................. 257/676 |
| 2010/0301474 A1 * | 12/2010 | Yang ............................. 257/737 |
| 2011/0024894 A1 * | 2/2011 | Perng ..................... H01L 221/561 257/692 |
| 2011/0303936 A1 * | 12/2011 | Wu ......................... H01L 33/62 257/98 |

* cited by examiner

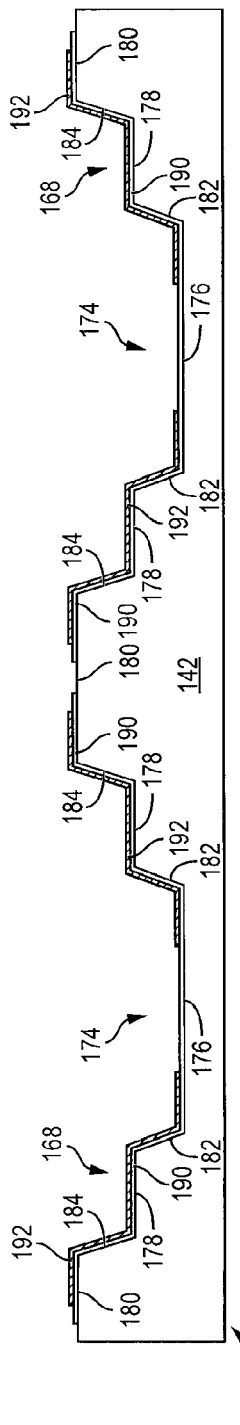
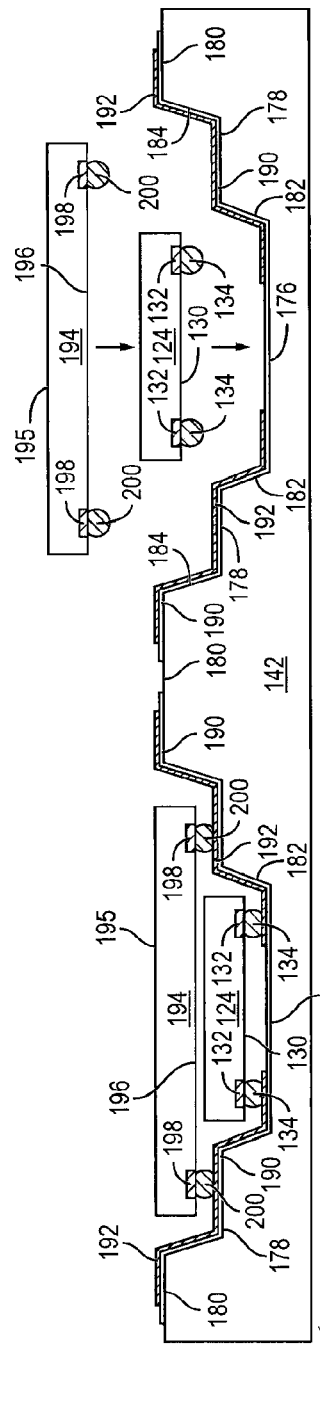
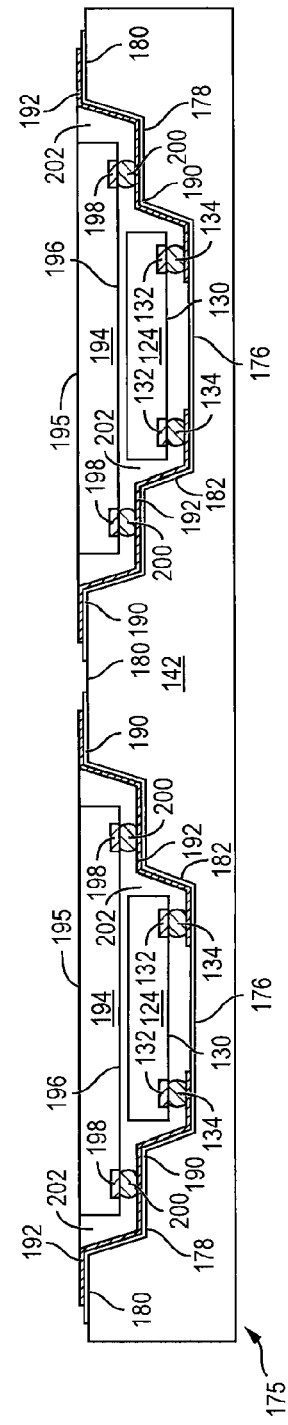
FIG. 4g
FIG. 4h
FIG. 4i

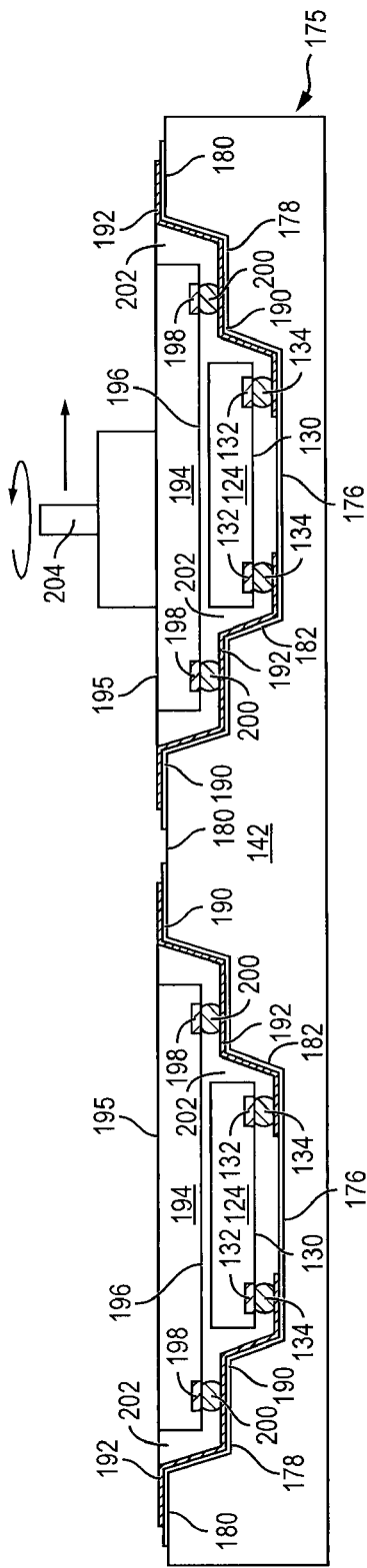
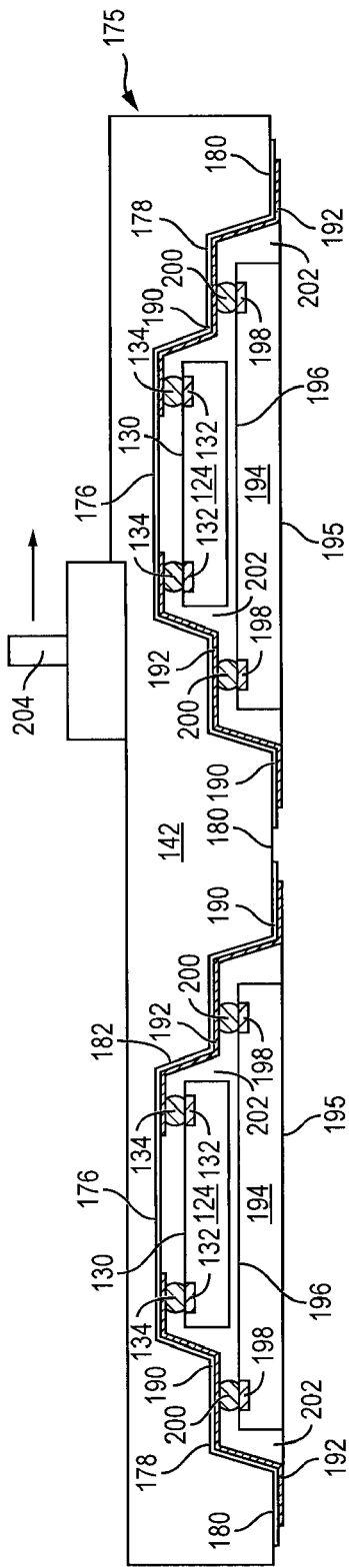
FIG. 4j
FIG. 4k

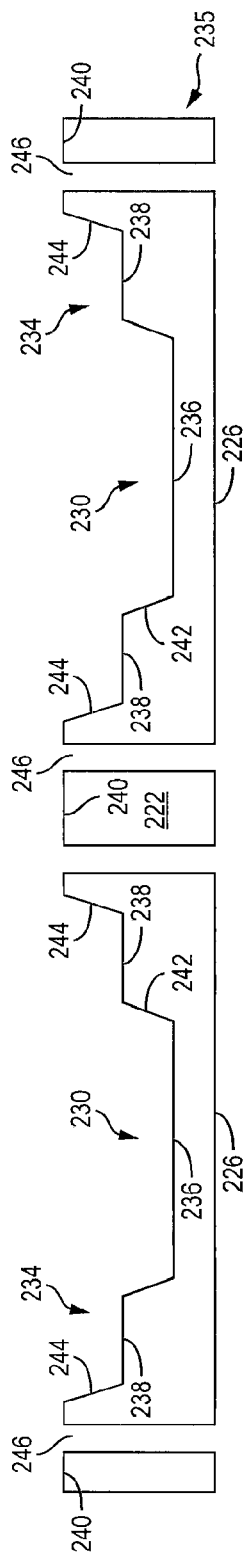
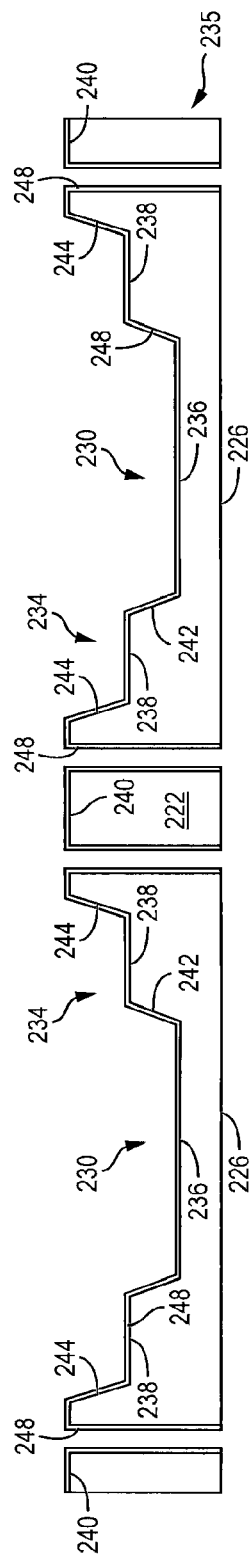
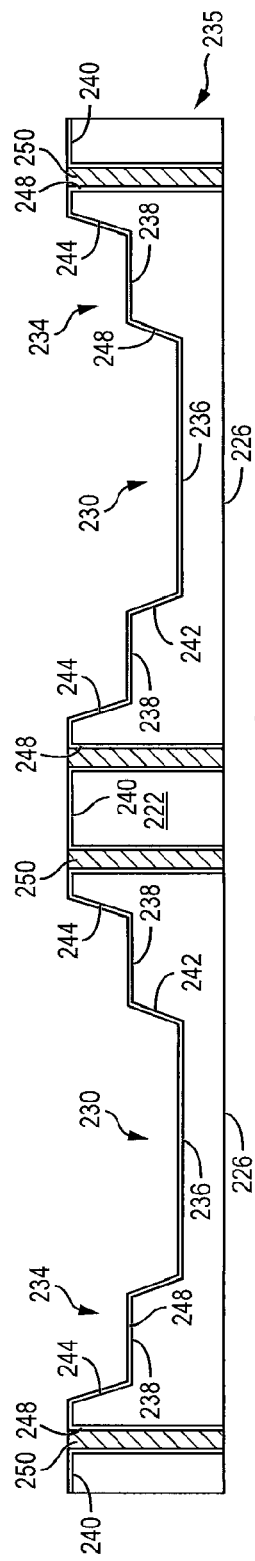

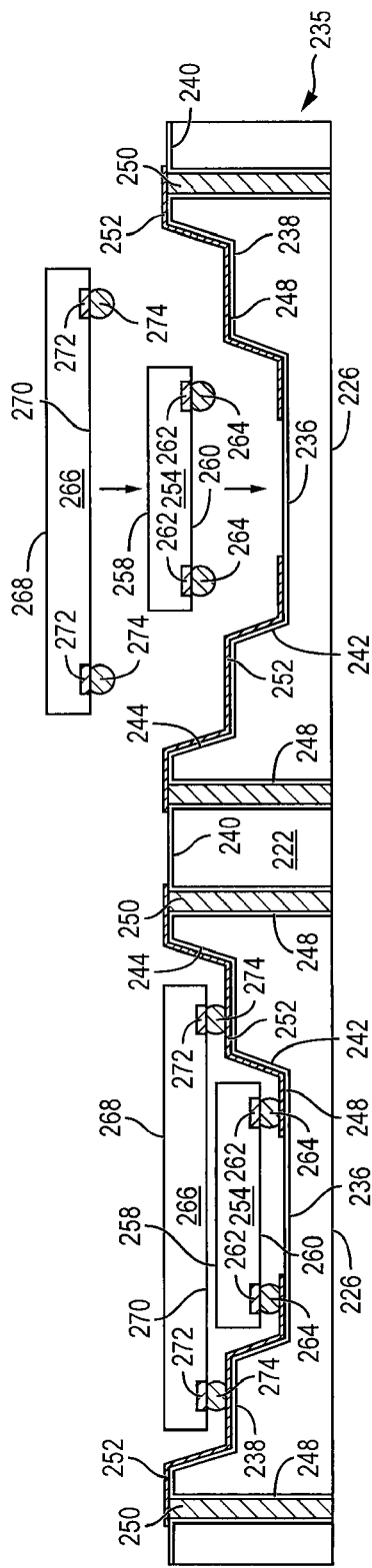
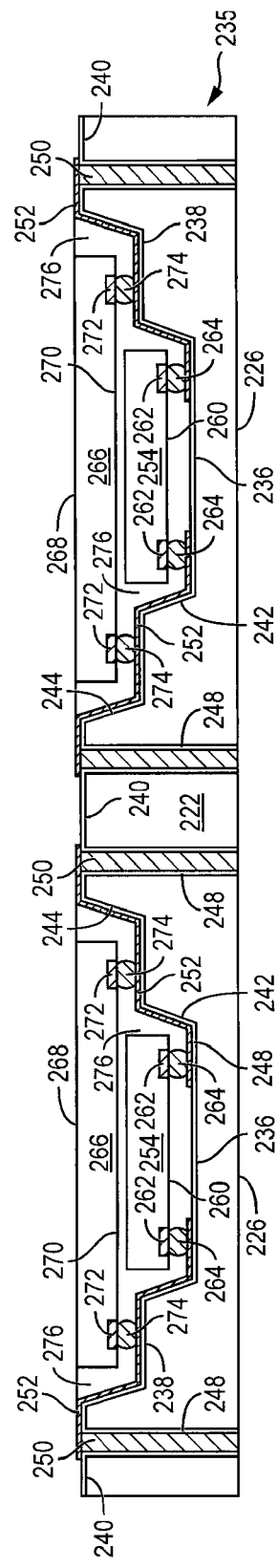
FIG. 6i
FIG. 6j

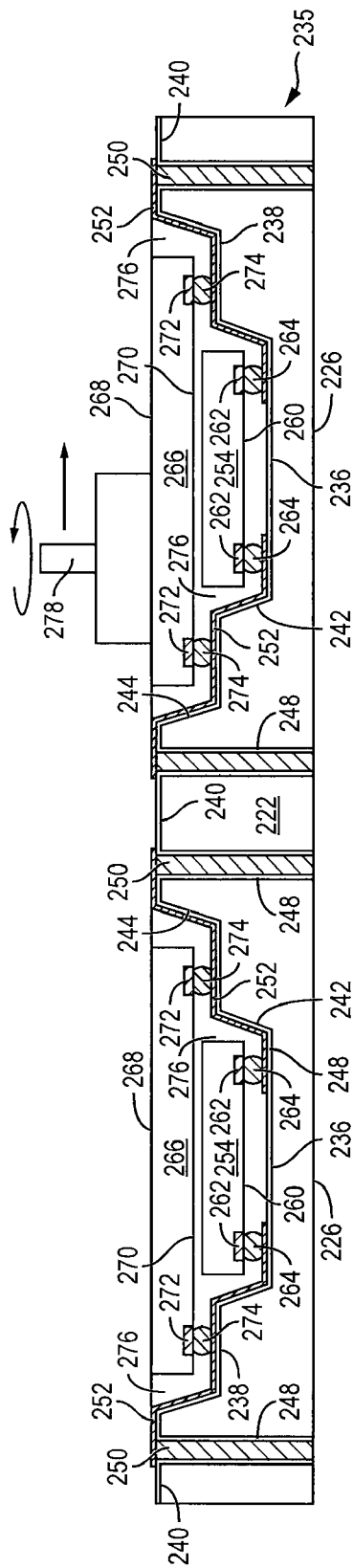
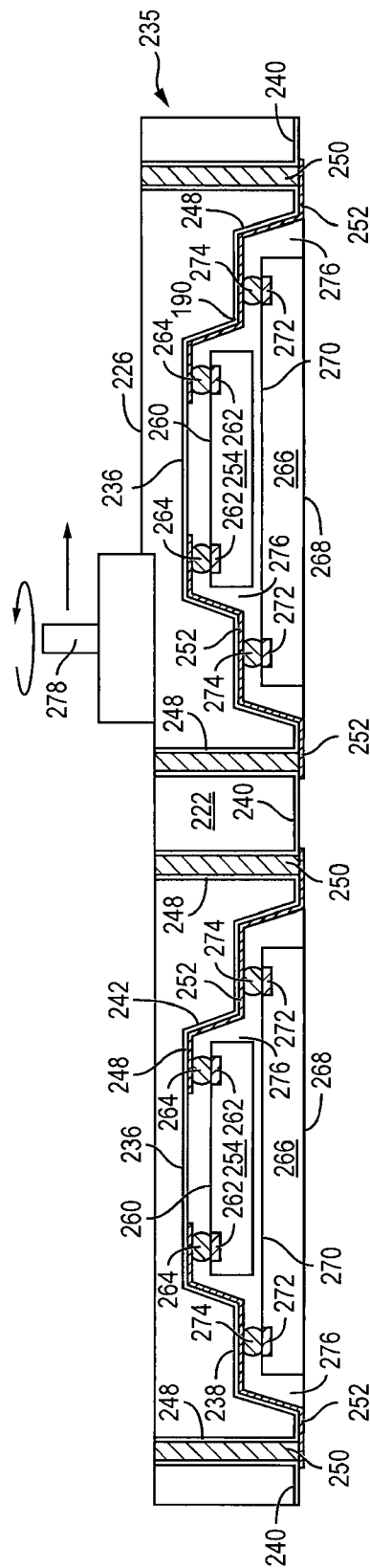
FIG. 6k
FIG. 6l

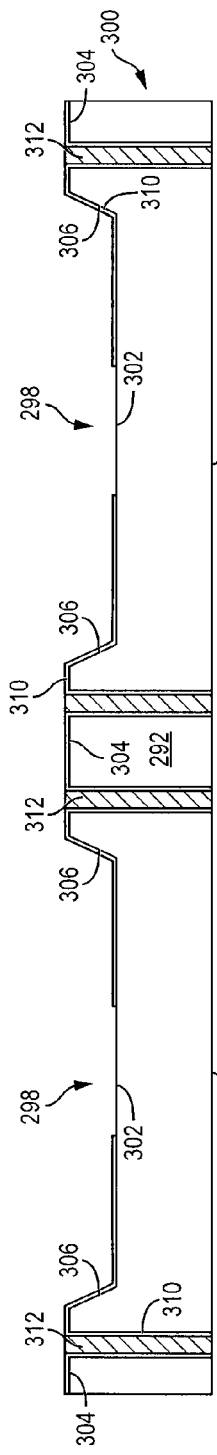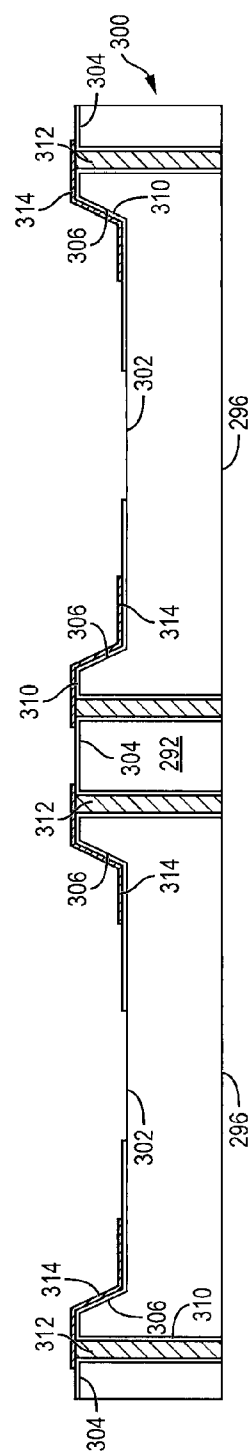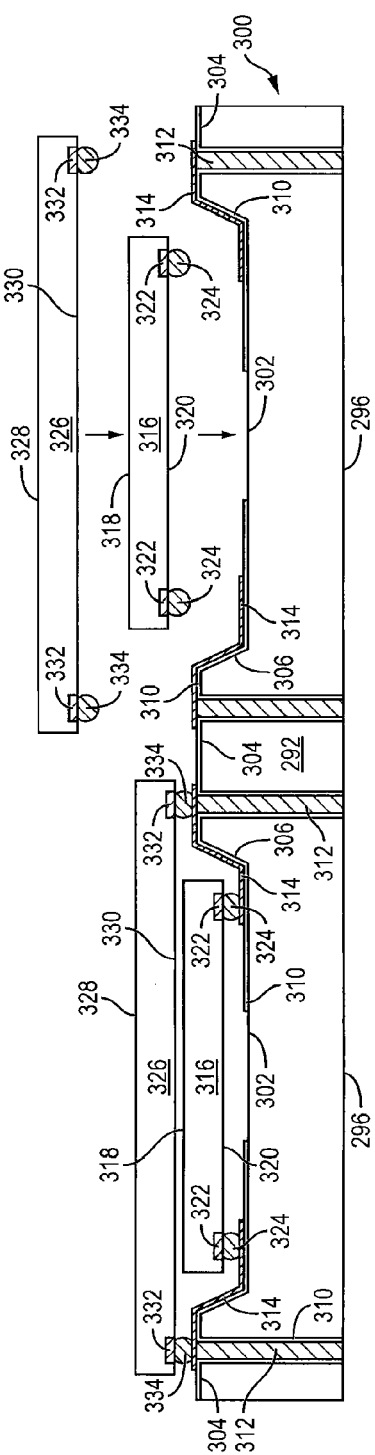

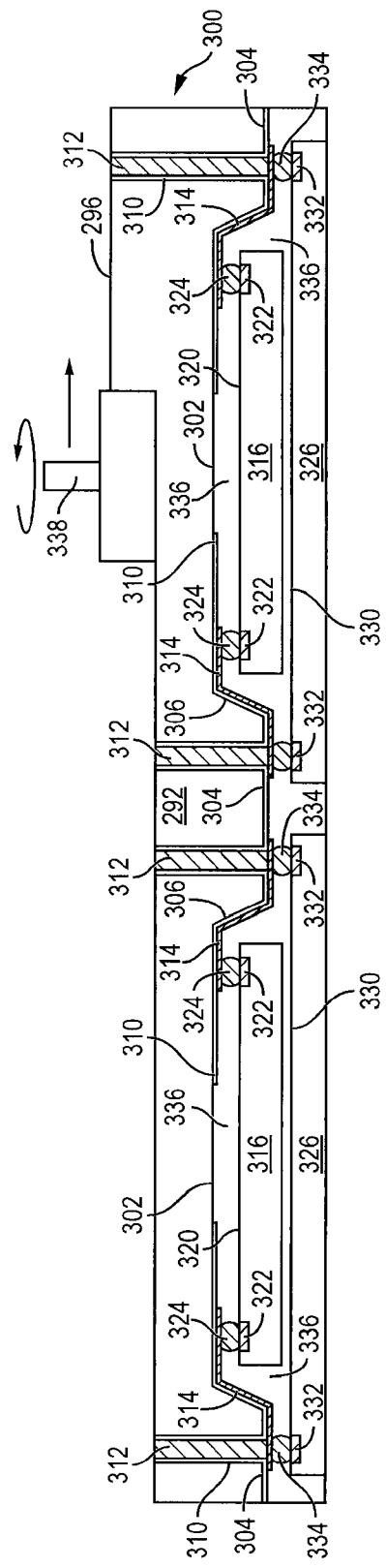
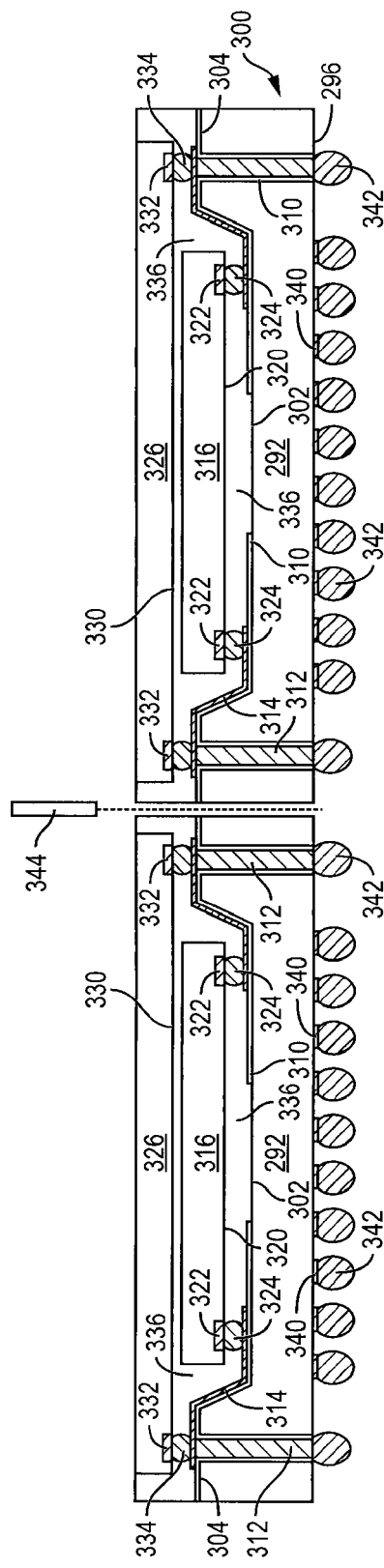
FIG. 8i
FIG. 8j

SEMICONDUCTOR DEVICE AND METHOD OF FORMING STEPPED INTERPOSER FOR STACKING AND ELECTRICALLY CONNECTING SEMICONDUCTOR DIE

FIELD OF THE INVENTION

The present invention relates in general to semiconductor devices and, more particularly, to a semiconductor device and method of forming a stepped interposer for stacking and electrically connecting semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In some applications, semiconductor die are mounted to a silicon substrate to reduce warpage issues commonly found with laminate substrates. Flipchip type semiconductor die are popular due to cost and manufacturing complexity of forming electrical interconnections with bond wires. Flipchip type semiconductor die have an advantage with faster signal transfer rates. However, stacking flipchip type semiconductor die over the silicon substrate increases the package height. Due to the thickness of the semiconductor die, the bumps are necessarily large to span the gap between the stacked die. The large bumps restrict the interconnect pitch and reduce the input/output (I/O) count. In addition, large bumps are susceptible to collapse which can cause electrical short and device defects.

SUMMARY OF THE INVENTION

A need exists for stacked flipchip type semiconductor die within a silicon interposer with small bumps and fine interconnect pitch. Accordingly, in one embodiment, the present invention is a method of making a semiconductor device comprising the steps of providing a semiconductor substrate, forming a first recess in the semiconductor substrate, and forming a second recess in the semiconductor substrate over the first recess. The second recess is a different size than the first recess to provide a stepped interposer. The method further includes the steps of forming an insulating layer following a contour of the stepped interposer, forming a conductive layer over the insulating layer following a contour of the stepped interposer, mounting a first semiconductor die partially disposed in the first recess and electrically connected to the conductive layer, mounting a second semiconductor die partially disposed in the second recess and electrically connected to the conductive layer, and depositing an encapsulant over the first and second semiconductor die.

In another embodiment, the present invention is a method of making a semiconductor device comprising the steps of providing a semiconductor substrate, forming a recess in the semiconductor substrate to provide a stepped interposer, forming an insulating layer over the stepped interposer, forming a conductive layer over the insulating layer, mounting a first semiconductor die in the stepped interposer electrically connected to the conductive layer, mounting a second semiconductor die over the first semiconductor die electrically connected to the conductive layer, and depositing an encapsulant over the first and second semiconductor die.

In another embodiment, the present invention is a method of making a semiconductor device comprising the steps of providing a stepped interposer, forming a conductive layer following a contour of the stepped interposer, mounting a first semiconductor die in the stepped interposer electrically connected to the conductive layer, mounting a second semiconductor die over the first semiconductor die electrically connected to the conductive layer, and depositing an encapsulant over the first and second semiconductor die.

In another embodiment, the present invention is a semiconductor device comprising a stepped interposer and conductive layer following a contour of the stepped interposer. A first semiconductor die is mounted in the stepped interposer and electrically connected to the conductive layer. A second semiconductor die is mounted over the first semiconductor die and electrically connected to the conductive layer. An encapsulant is deposited over the first and second semiconductor die.

BRIEF DESCRIPTION OF THE DRAWINGS

FIGS. 4a-4l illustrate a process of forming a multi-stepped interposer for stacking and electrically connecting semiconductor die;

FIGS. 6a-6m illustrate a process of forming a multi-stepped interposer with conductive TSV for stacking and electrically connecting semiconductor die;

FIGS. 8a-8j illustrate a process of forming a stepped interposer with conductive TSV for stacking and electrically connecting semiconductor die;

DETAILED DESCRIPTION OF THE DRAWINGS

Figure 1:
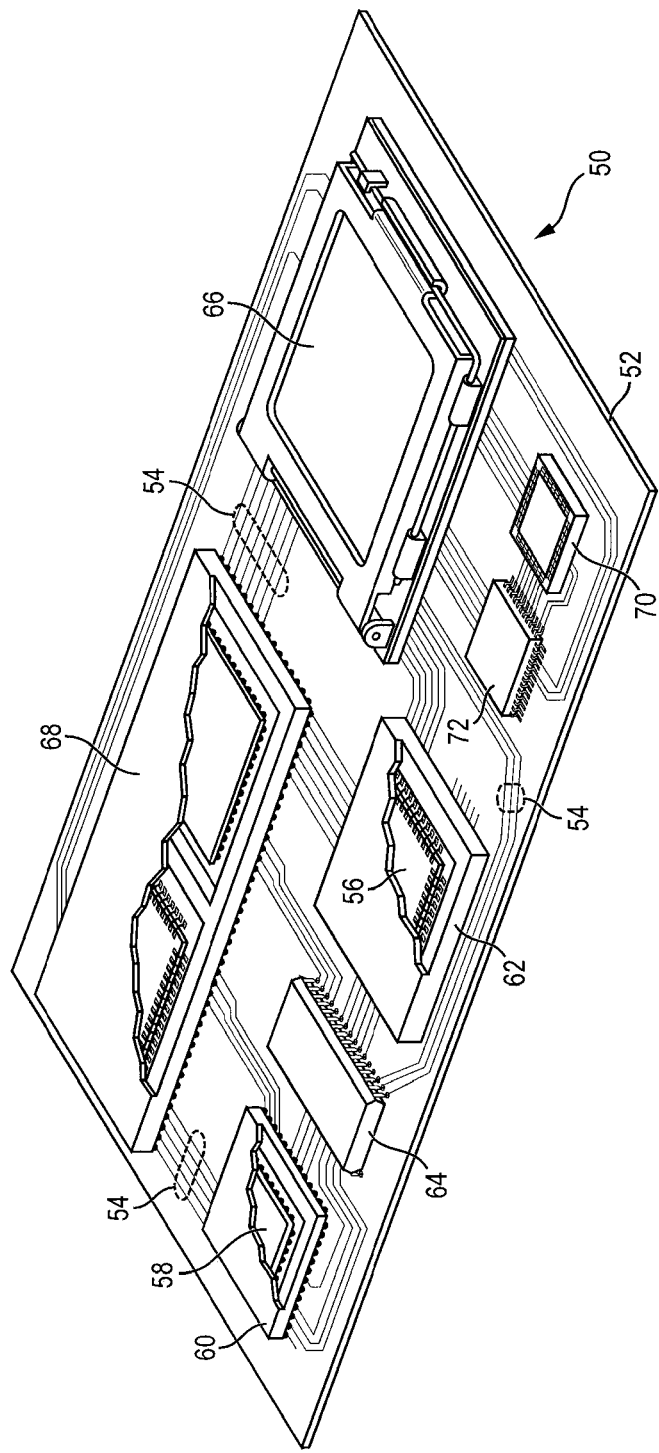
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
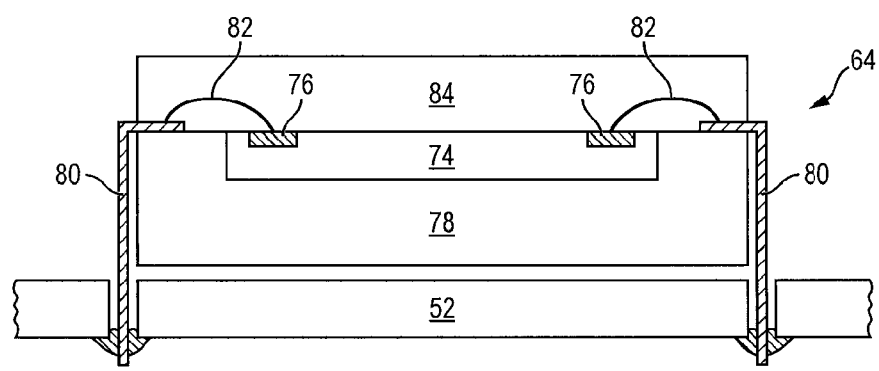
FIGS. 2a-2c illustrate further detail of the semiconductor packages mounted to the PCB.
Figure 2B:
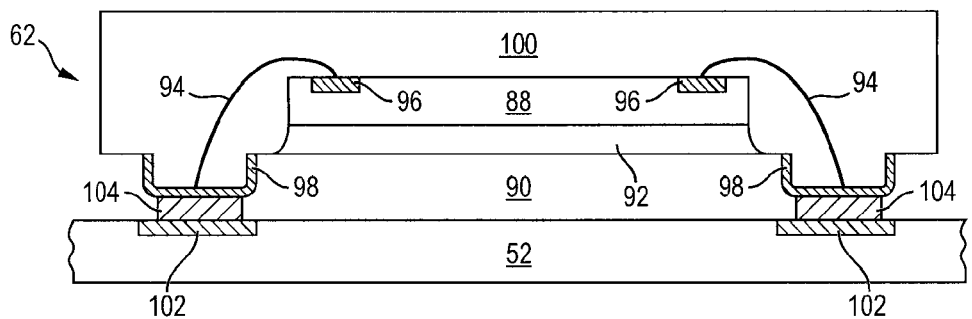
Figure 2C:
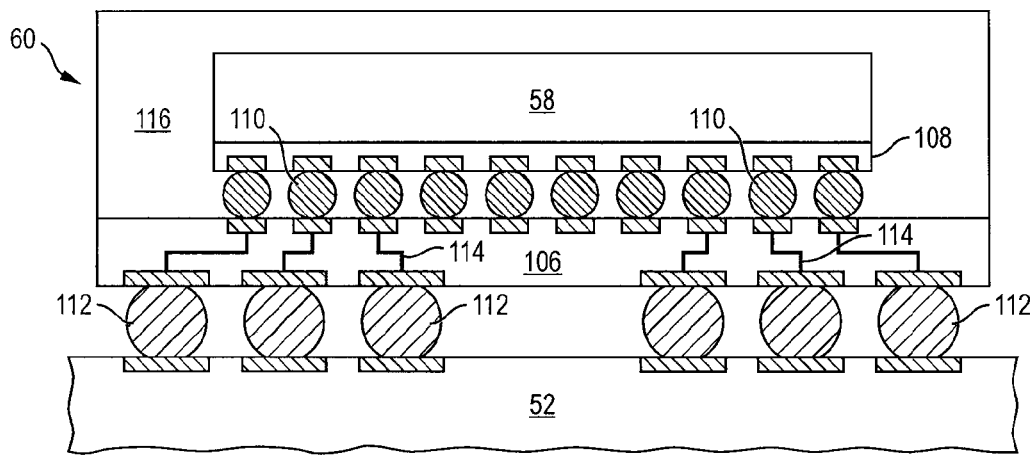

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2*b* illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
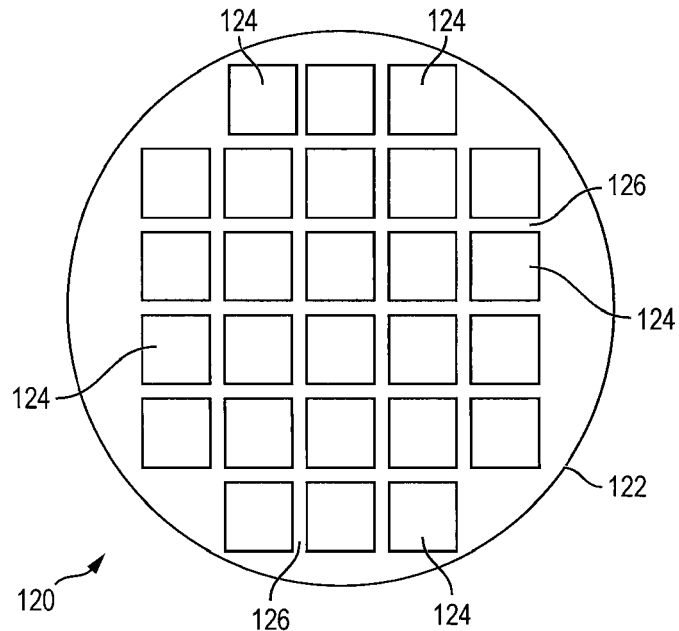
FIGS. 3a-3c illustrate a semiconductor wafer with a plurality of semiconductor die separated by saw streets.

FIG. 3*a* shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
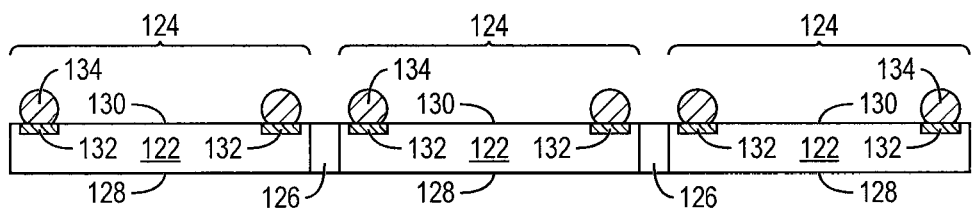

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132.

Figure 3C:
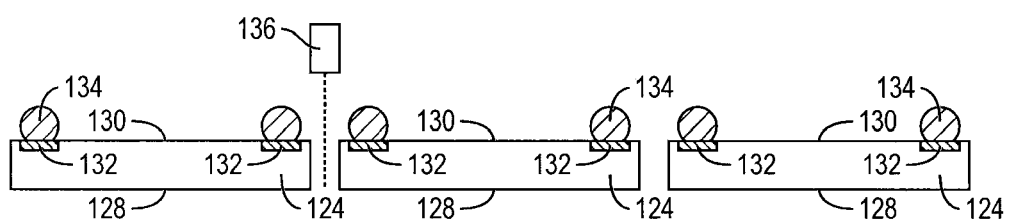

In FIG. 3c, semiconductor wafer 120 is singulated through saw street 126 using a saw blade or laser cutting tool 136 into individual semiconductor die 124.

Figure 4A:
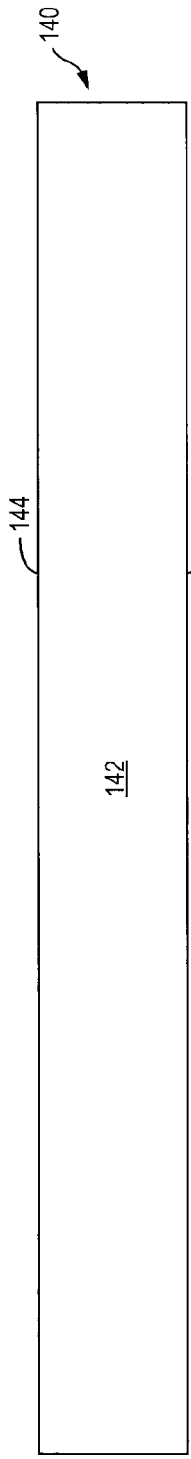

FIGS. 4a-4l illustrate, in relation to FIGS. 1 and 2a-2c, a process of forming a multi-stepped interposer for stacking and electrically connecting semiconductor die. FIG. 4a shows semiconductor wafer 140 with a base substrate material 142, such as silicon, germanium, gallium arsenide, indium phosphide, or silicon carbide, for structural support. Semiconductor wafer 140 has a top surface 144 and bottom surface 146, opposite the top surface.

Figure 4B:
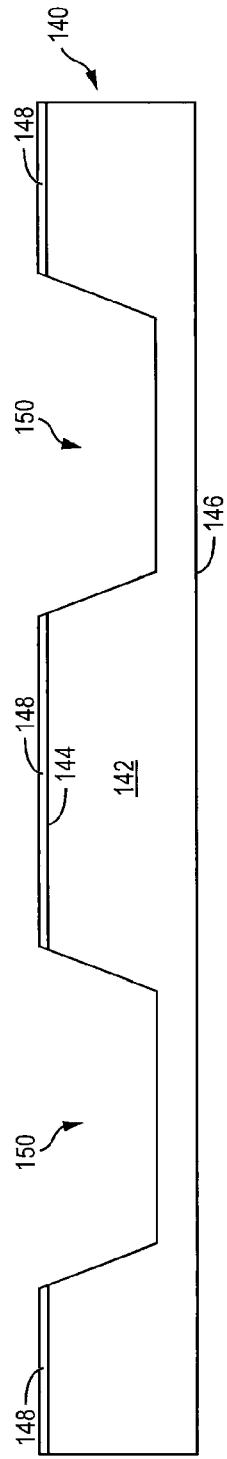

In FIG. 4b, a portion of semiconductor wafer 140 is removed from surface 144 by a wet etch in solution with a masking layer 148 to form recess 150. Recess 150 has sufficient width and depth to contain later mounted semiconductor die 124. Recess 150 extends partially but not completely through semiconductor wafer 140.

Figure 4C:
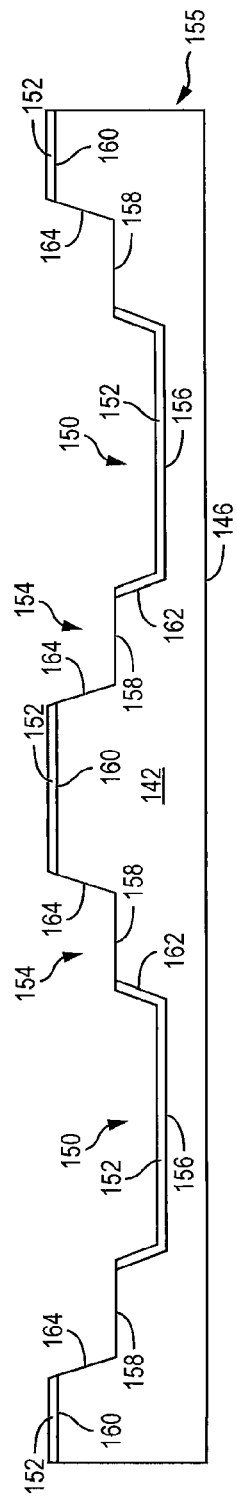

In FIG. 4c, another portion of semiconductor wafer 140 is removed from surface 144 over recess 150 by a wet etch in solution with a masking layer 152 to form recess 154. Alternatively, recesses 150 and 154 can be formed by laser or mechanical cutting. Recess 154 extends partially but not completely through semiconductor wafer 140. Recess 154 has sufficient width and depth to partially contain a later mounted semiconductor die. Recess 154 is wider and shallower than recess 150 such that the combination of recesses 150 and 154 forms a multi-stepped interposer 155 with a first flat portion 156 from the bottom of recess 150, second flat portion 158 from the bottom of recess 154, and third flat portion 160 as top surface 144. The riser portions 162 and 164 of recesses 150 and 154, i.e., between flat portions 156-158 and 158-160, can be vertical or angled.

Figure 4D:
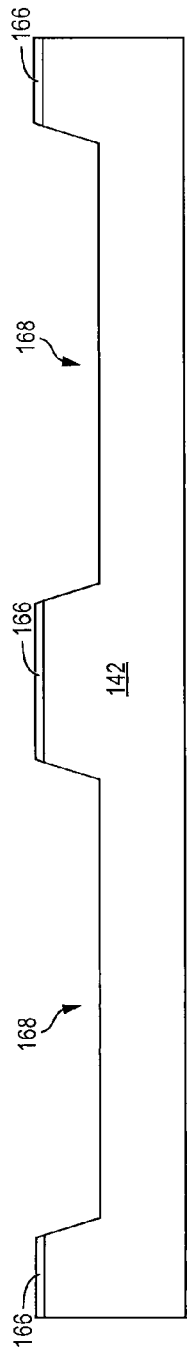
Figure 4E:
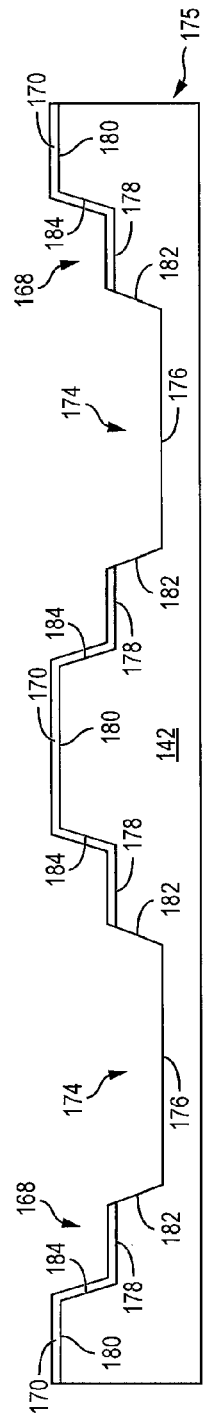

Another embodiment of forming the recesses in semiconductor wafer 140 is shown in FIGS. 4d-4e. A portion of semiconductor wafer 140 is removed from surface 144 by a wet etch in solution with a masking layer 166 to form recess 168. Recess 168 has sufficient width and depth to partially contain a later mounted semiconductor die. Recess 168 extends partially but not completely through semiconductor wafer 140.

In FIG. 4e, another portion of semiconductor wafer 140 is removed from the bottom of recess 168 by a wet etch in solution with a masking layer 170 to form recess 174. Recess 174 extends partially but not completely through semiconductor wafer 140. Recess 174 has sufficient width and depth to partially contain a later mounted semiconductor die. Recess 174 is narrower than recess 168 such that the combination of recesses 168 and 174 forms a multi-stepped interposer 175 with a first flat portion 176 from the bottom of recess 174, second flat portion 178 from the bottom of recess 168, and third flat portion 180 as top surface 144. The riser portion 182 and 184 of recesses 168 and 174, i.e., between flat portions 176-178 and 178-180, can be vertical or angled.

Figure 4F:
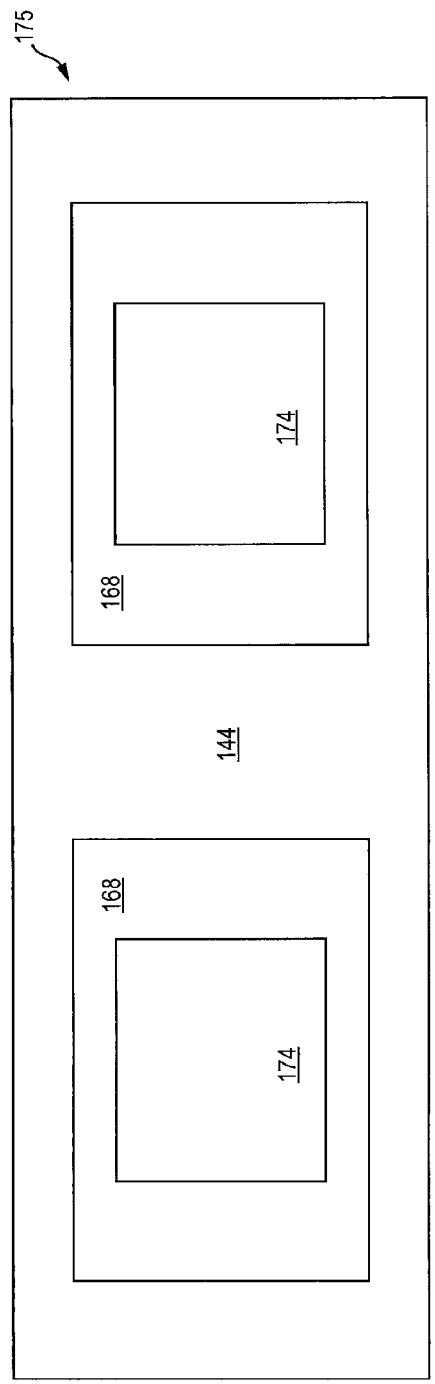

FIG. 4f shows a top view of multi-stepped interposer 175 with recesses 168 and 174 (or multi-stepped interposer 155 with recesses 150 and 154). Additional steps can be formed in interposer 175 using a similar process described in FIGS. 4b-4c or 4d-4e.

In FIG. 4g, an insulating or passivation layer 190 is conformally applied over multi-stepped interposer 175 using PVD, CVD, screen printing, spin coating, spray coating, sintering or thermal oxidation. The insulating layer 190 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The insulating layer 190 follows the contour of multi-stepped interposer 175. Accordingly, flat portions 176-180 and riser portions 182 and 184 of recesses 168 and 174 are uniformly covered by insulating layer 190.

An electrically conductive layer or RDL 192 is formed over insulating layer 190 using a patterning and metal deposition process such as printing, PVD, CVD, sputtering, electrolytic plating, and electroless plating. Conductive layer 192 can be one or more layers of Al, Cu, Sn, Ni, Au, Ag, or other suitable electrically conductive material. Conductive layer 192 follows the contour of multi-stepped interposer 175. Conductive layer 192 provides an electrical path between flat portion 176, flat portion 178, and flat portion 180 of the multi-stepped interposer 175 for electrical interconnect of the later mounted semiconductor die. The portions of conductive layer 192 can be electrically common or electrically isolated depending on the design and function of the later mounted semiconductor die.

In FIG. 4h, semiconductor die 124 from FIGS. 3a-3c are mounted into recess 174 with active surface 130 oriented toward multi-stepped interposer 175. Bumps 134 are metallurgically and electrically connected to conductive layer 192 over flat portion 176. A second semiconductor wafer provides semiconductor die 194, in a similar manner to FIGS. 3a-3c. Semiconductor die 194 has a back surface 195 and active surface 196 with contact pads 198 formed on the active surface. Bumps 200 are formed on contact pads 198. In one embodiment, semiconductor die 194 is a flipchip type semiconductor die. Semiconductor die 194 are larger than semiconductor die 124. Semiconductor die 194 are mounted into recess 168 with active surface 196 oriented toward multi-stepped interposer 175. Bumps 200 are metallurgically and electrically connected to conductive layer 192 over flat portion 178.

In FIG. 4i, an encapsulant or molding compound 202 is deposited over multi-stepped interposer 175 and semiconductor die 124 and 194 using a paste printing, compressive molding, transfer molding, liquid encapsulant molding, vacuum lamination, spin coating, or other suitable applicator. Encapsulant 202 can be polymer composite material, such as epoxy resin with filler, epoxy acrylate with filler, or polymer with proper filler. Encapsulant 202 is non-conductive and environmentally protects the semiconductor device from external elements and contaminants.

In FIG. 4j, back surface 195 of semiconductor die 194 and encapsulant 202 undergo a grinding operation with grinder 204 to planarize the surfaces and reduce the height of multi-stepped interposer 175. In addition, bottom surface 146 can undergo a grinding operation with grinder 204 to further reduce the height of multi-stepped interposer 175, as shown in FIG. 4k.

Figure 4L:
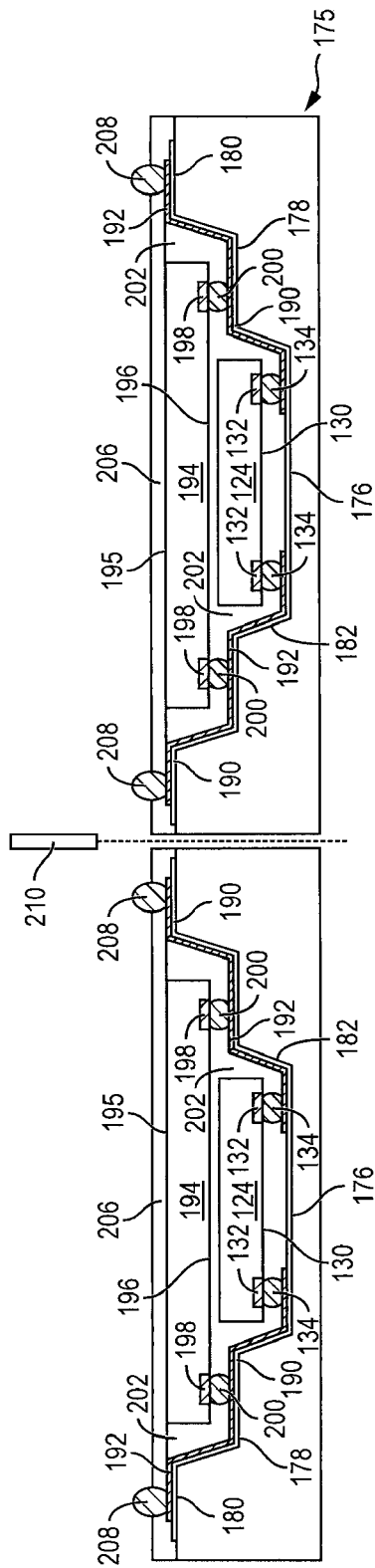

In FIG. 4l, an insulating or solder resist layer 206 is deposited over back surface 195, encapsulant 202, and conductive layer 192. A portion of solder resist layer 206 is removed by an etching process to expose conductive layer 192 over flat portion 180.

An electrically conductive bump material is deposited over the exposed conductive layer 192 on flat portion 180 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 192 using a suitable attachment or bonding process. In one embodiment, the bump material is reflowed by heating the material above its melting point to form spherical balls or bumps 208. In some applications, bumps 208 are reflowed a second time to improve electrical contact to conductive layer 192. The bumps can also be compression bonded to conductive layer 192. Bumps 208 represent one type of interconnect structure that can be formed over conductive layer 192. The interconnect structure can also use stud bump, micro bump, or other electrical interconnect.

Figure 5:
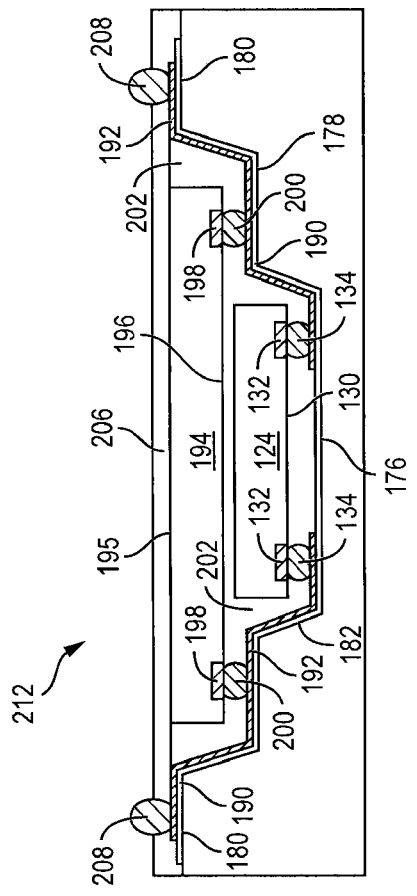
FIG. 5 illustrates the stacked die within the multi-stepped interposer after singulation.

Semiconductor die 124 and 194 are singulated through multi-stepped interposer 175 with saw blade or laser cutting tool 210 into individual stacked die within the interposer, generally designated as 212. FIG. 5 shows stacked die 212 after singulation. Semiconductor die 124 is electrically connected through contact pads 132 and bumps 134 to conductive layer 192. Likewise, semiconductor die 194 is electrically connected through contact pads 198 and bumps 200 to conductive layer 192. Conductive layer 192 provides electrical connection between stacked semiconductor die 124 and 194, as well as electrical connection to external devices through bumps 208. Semiconductor die 124 and 194 are disposed within recesses 174 and 168 to reduce the height of stacked die 212. The grinding operation further reduces the height of stacked die 212 without introducing warpage issues. The multi-stepped interposer 175 provides for small bumps 134 and 200 and a fine interconnect pitch. The small size and fine pitch of bumps 134 and 200 increase I/O count and reduce bump collapse. Additional steps can be formed in the multi-stepped interposer, as described in FIGS. 4b-4c or 4d-4e, to accommodate more stacked semiconductor die.

Figure 6A:
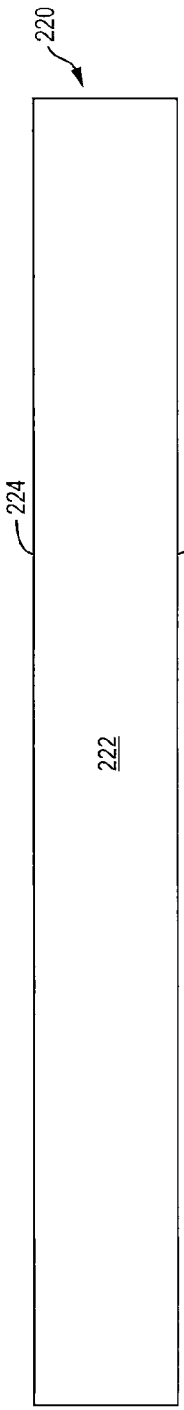

In another embodiment, FIGS. 6a-6m illustrate a process of forming a multi-stepped interposer with conductive vias for stacking and electrically connecting semiconductor die. FIG. 6a shows semiconductor wafer 220 with a base substrate material 222, such as silicon, germanium, gallium arsenide, indium phosphide, or silicon carbide, for structural support. Semiconductor wafer 220 has a top surface 224 and bottom surface 226, opposite the top surface.

Figure 6B:
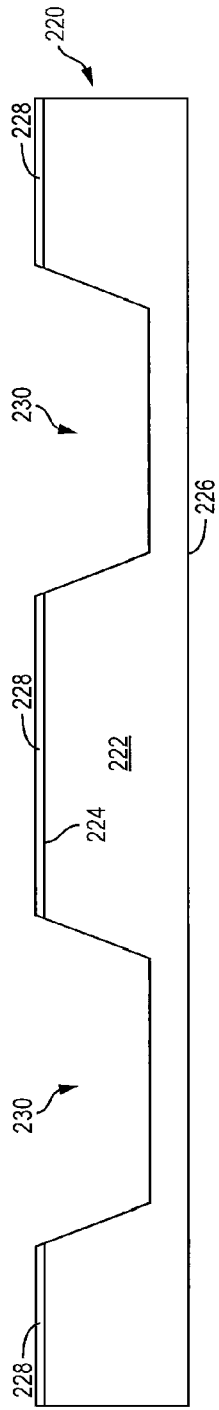

In FIG. 6b, a portion of semiconductor wafer 220 is removed from surface 224 by a wet etch in solution with a masking layer 228 to form recess 230. Recess 230 has sufficient width and depth to contain a later mounted semiconductor die. Recess 230 extends partially but not completely through semiconductor wafer 220.

Figure 6C:
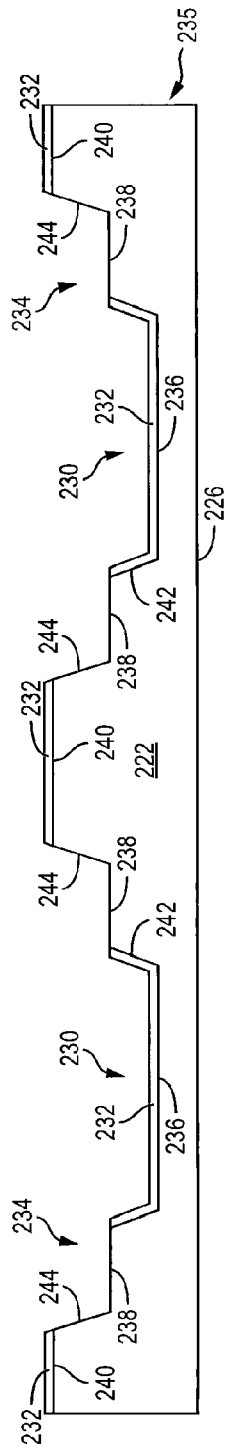

In FIG. 6c, another portion of semiconductor wafer 220 is removed from surface 224 over recess 230 by a wet etch in solution with a masking layer 232 to form recess 234. Alternatively, recesses 230 and 234 can be formed by laser or mechanical cutting. Recess 234 extends partially but not completely through semiconductor wafer 220. Recess 234 has sufficient width and depth to partially contain a later mounted semiconductor die. Recess 234 is wider and shallower than recess 230 such that the combination of recesses 230 and 234 forms a multi-stepped interposer 235 with a first flat portion 236 from the bottom of recess 230, second flat portion 238 from the bottom of recess 234, and third flat portion 240 as top surface 224. The riser portions 242 and 244 of recesses 230 and 234, i.e., between flat portions 236-238 and 238-240, can be vertical or angled. The multi-stepped interposer 235 can also be formed similar to FIGS. 4d-4e.

In FIG. 6d, a plurality of vias 246 is formed through multi-stepped interposer 235 using laser drilling, mechanical drilling, or deep reactive ion etching (DRIE).

In FIG. 6e, an insulating or passivation layer 248 is conformally applied over multi-stepped interposer 235, including into vias 246 and over flat portions 236-240 and riser portions 242-244, using PVD, CVD, screen printing, spin coating, spray coating, sintering or thermal oxidation. The insulating layer 248 contains one or more layers of SiO2, Si3N4, SiON, Ta2O5, Al2O3, or other material having similar insulating and structural properties. The insulating layer 248 follows the contour of multi-stepped interposer 235 and vias 246. Accordingly, flat portions 236-240 and riser portions 242 and 244 of recesses 230 and 234 are uniformly covered by insulating layer 248.

In FIG. 6f, vias 246 are filled with Al, Cu, Sn, Ni, Au, Ag, Ti, W, poly-silicon, or other suitable electrically conductive material using electrolytic plating, electroless plating process, or other suitable metal deposition process to form z-direction vertical conductive through silicon vias (TSV) 250. Conductive TSV 250 provide vertical electrical interconnect between surfaces 224 and 226.

Figure 6G:
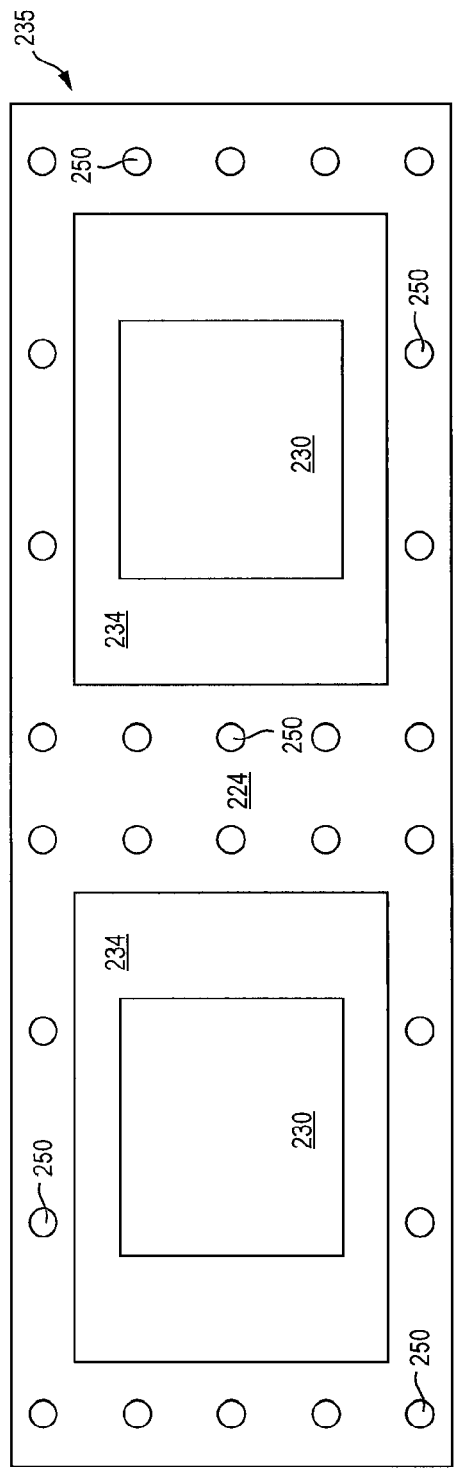

FIG. 6g shows a top view of multi-stepped interposer 235 with recesses 230 and 234 and surrounding conductive TSV 250. Additional steps can be formed in interposer 235 using a similar process described in FIGS. 6b-6c.

Figure 6H:
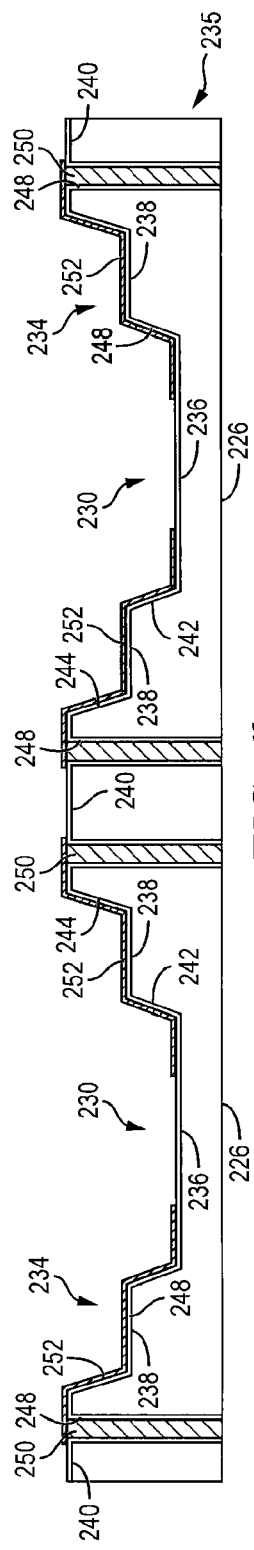

In FIG. 6h, an electrically conductive layer or RDL 252 is formed over insulating layer 248 and conductive TSV 250 using a patterning and metal deposition process such as printing, PVD, CVD, sputtering, electrolytic plating, and electroless plating. Conductive layer 252 can be one or more layers of Al, Cu, Sn, Ni, Au, Ag, or other suitable electrically conductive material. Conductive layer 252 follows the contour of multi-stepped interposer 235. Conductive layer 252 provides an electrical path between flat portion 236, flat portion 238, and flat portion 240 of the multi-stepped interposer 235. One portion of conductive layer 252 is electrically connected to conductive TSV 250. Other portions of conductive layer 252 can be electrically common or electrically isolated depending on the design and function of the later mounted semiconductor die.

In FIG. 6i, semiconductor die 254, similar to FIGS. 3a-3c, has a back surface 258 and active surface 260 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 260 to implement analog circuits or digital circuits, such as DSP, ASIC, memory, or other signal processing circuit. Semiconductor die 254 may also contain IPDs, such as inductors, capacitors, and resistors, for RF signal processing. Contact pads 262 are formed over active surface 260 and bumps 264 are formed on the contact pads. In one embodiment, semiconductor die 254 is a flipchip type semiconductor die.

Semiconductor die 254 are mounted into recess 230 with active surface 260 oriented toward multi-stepped interposer 235. Bumps 264 are metallurgically and electrically connected to conductive layer 252 over flat portion 236.

Semiconductor die 266, similar to FIGS. 3a-3c, has a back surface 268 and active surface 270 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 270 to implement analog circuits or digital circuits, such as DSP, ASIC, memory, or other signal processing circuit. Semiconductor die 266 may also contain IPDs, such as inductors, capacitors, and resistors, for RF signal processing. Contact pads 272 are formed over active surface 270 and bumps 274 are formed on the contact pads. In one embodiment, semiconductor die 266 is a flipchip type semiconductor die. Semiconductor die 266 are larger than semiconductor die 254.

Semiconductor die 266 are mounted into recess 234 with active surface 270 oriented toward multi-stepped interposer 235. Bumps 274 are metallurgically and electrically connected to conductive layer 252 over flat portion 238.

In FIG. 6j, an encapsulant or molding compound 276 is deposited over multi-stepped interposer 235 and semiconductor die 254 and 266 using a paste printing, compressive molding, transfer molding, liquid encapsulant molding, vacuum lamination, spin coating, or other suitable applicator. Encapsulant 276 can be polymer composite material, such as epoxy resin with filler, epoxy acrylate with filler, or polymer with proper filler. Encapsulant 276 is non-conductive and environmentally protects the semiconductor device from external elements and contaminants.

In FIG. 6k, back surface 268 of semiconductor die 266 and encapsulant 276 undergo a grinding operation with grinder 278 to planarize the surfaces and reduce the height of multi-stepped interposer 235. In addition, bottom surface 226 can undergo a grinding operation with grinder 278 to further reduce the height of multi-stepped interposer 235, as shown in FIG. 6l.

Figure 6M:
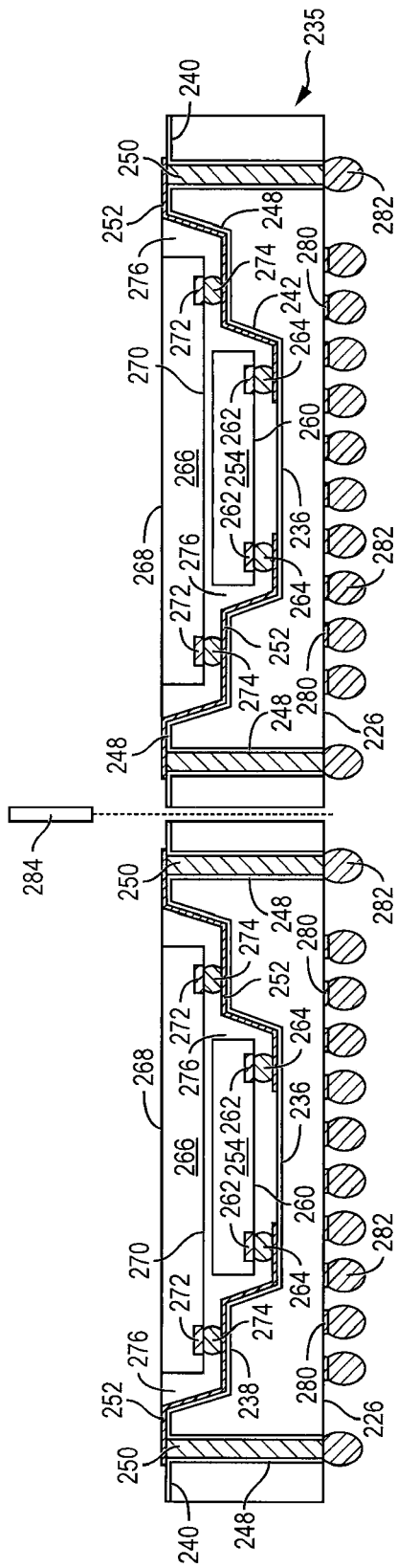

In FIG. 6m, an electrically conductive layer or RDL 280 is formed over bottom surface 226 using a patterning and metal deposition process such as printing, PVD, CVD, sputtering, electrolytic plating, and electroless plating. Conductive layer 280 can be one or more layers of Al, Cu, Sn, Ni, Au, Ag, or other suitable electrically conductive material. The portions of conductive layer 280 can be electrically common or electrically isolated depending on the design and function of semiconductor die 254 and 266.

An electrically conductive bump material is deposited over conductive TSV 250 and conductive layer 280 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 250 and conductive layer 280 using a suitable attachment or bonding process. In one embodiment, the bump material is reflowed by heating the material above its melting point to form spherical balls or bumps 282. In some applications, bumps 282 are reflowed a second time to improve electrical contact to conductive TSV 250 and conductive layer 280. The bumps can also be compression bonded to conductive TSV 250 and conductive layer 280. Bumps 282 represent one type of interconnect structure that can be formed over conductive TSV 250 and conductive layer 280. The interconnect structure can also use stud bump, micro bump, or other electrical interconnect.

Figure 7:
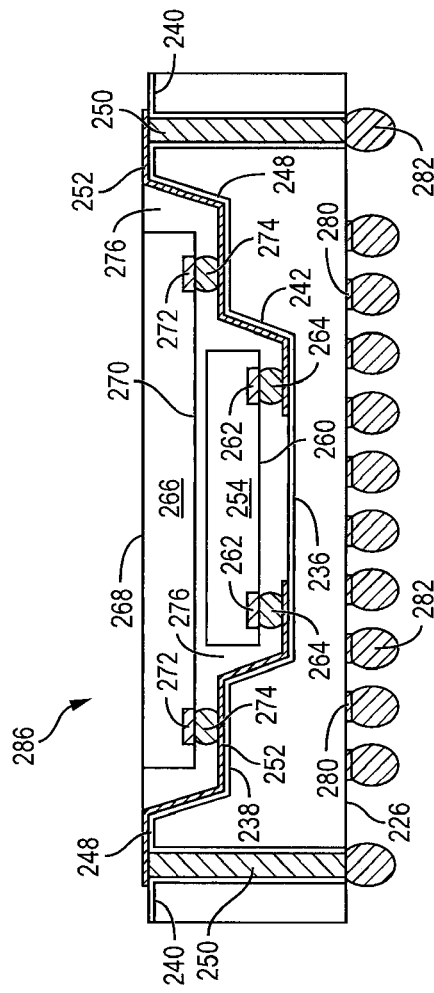
FIG. 7 illustrates the stacked die within the multi-stepped interposer with conductive TSV after singulation.

Semiconductor die 254 and 266 are singulated through multi-stepped interposer 235 with saw blade or laser cutting tool 284 into individual stacked die within the interposer, generally designated as 286. FIG. 7 shows stacked die 286 after singulation. Semiconductor die 254 is electrically connected through contact pads 262 and bumps 264 to conductive layer 252. Likewise, semiconductor die 266 is electrically connected through contact pads 272 and bumps 274 to conductive layer 252. Conductive layer 252 provides electrical connection between stacked semiconductor die 254 and 266, as well as electrical connection to external devices through conductive TSV 250 and bumps 282. Semiconductor die 254 and 266 are disposed within recesses 230 and 234 to reduce the height of stacked die 286. The grinding operation further reduces the height of stacked die 286 without introducing warpage issues. The multi-stepped interposer 235 provides for small bumps 264 and 274 and a fine interconnect pitch. The small size and fine pitch of bumps 264 and 274 increase I/O count and reduce bump collapse. Additional steps can be formed in the multi-stepped interposer 235, as described in FIGS. 6b-6c, to accommodate more stacked semiconductor die.

Figure 8A:
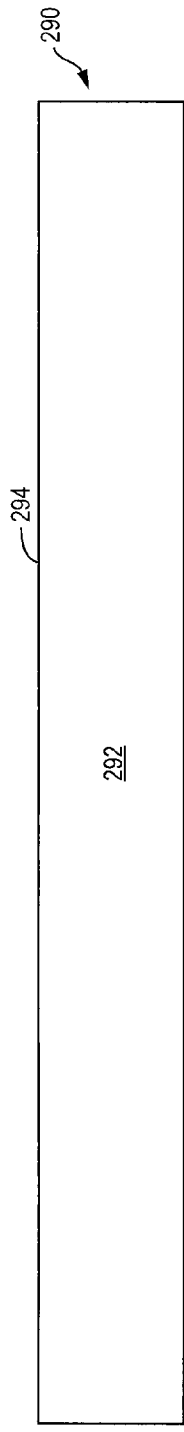

In another embodiment, FIGS. 8a-8j illustrate another process of forming a stepped interposer with conductive vias for stacking and electrically connecting semiconductor die. FIG. 8a shows semiconductor wafer 290 with a base substrate material 292, such as silicon, germanium, gallium arsenide, indium phosphide, or silicon carbide, for structural support. Semiconductor wafer 290 has a top surface 294 and bottom surface 296, opposite the top surface.

Figure 8B:
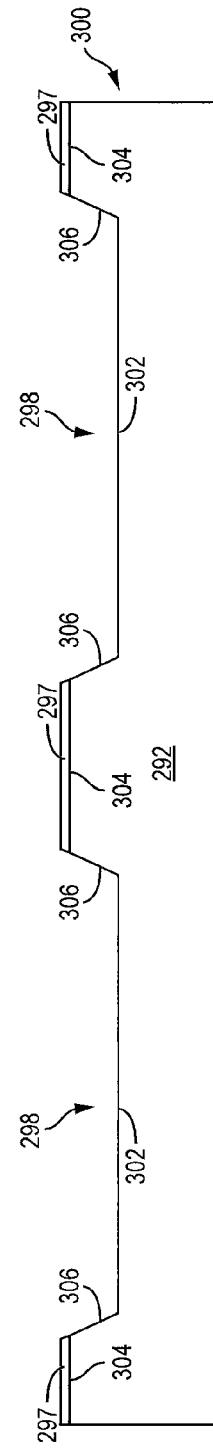

In FIG. 8b, a portion of semiconductor wafer 290 is removed from surface 294 by a wet etch in solution with a masking layer 297 to form recess 298. Recess 298 has sufficient width and depth to partially contain a later mounted semiconductor die. Recess 298 extends partially but not completely through semiconductor wafer 290. The stepped interposer 300 has a first flat portion 302 as the bottom of recess 298 and second flat portion 304 as top surface 294. The riser portion 306 of recess 298, i.e., between flat portions 302-304, can be vertical or angled.

Figure 8C:
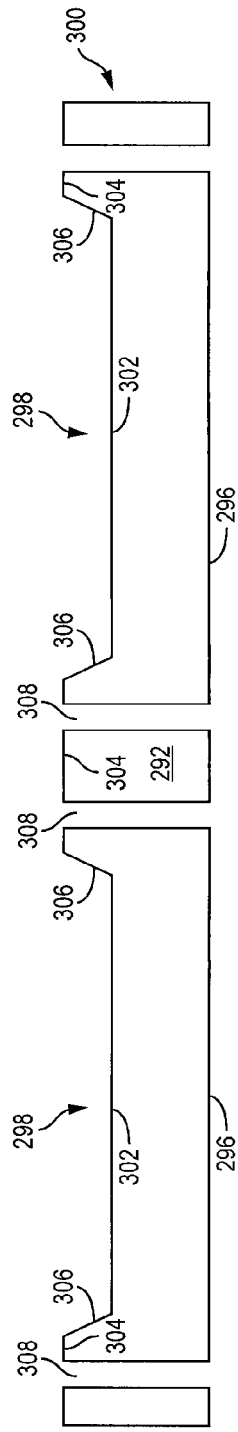

In FIG. 8c, a plurality of vias 308 is formed through stepped interposer 300 using laser drilling, mechanical drilling, or DRIE.

In FIG. 8d, an insulating or passivation layer 310 is conformally applied over stepped interposer 300, including into vias 308 and over flat portions 302-304 and riser portion 306, using PVD, CVD, screen printing, spin coating, spray coating, sintering or thermal oxidation. The insulating layer 310 contains one or more layers of SiO2, Si3N4, SiON, Ta2O5, Al2O3, or other material having similar insulating and structural properties. The insulating layer 310 follows the contour of stepped interposer 300 and vias 308. Accordingly, flat portions 302-304 and riser portion 306 of recess 298 are uniformly covered by insulating layer 310.

The vias 308 are filled with Al, Cu, Sn, Ni, Au, Ag, Ti, W, poly-silicon, or other suitable electrically conductive material using electrolytic plating, electroless plating process, or other suitable metal deposition process to form z-direction vertical conductive TSV 312. Conductive TSV 312 provide vertical electrical interconnect between surfaces 294 and 296.

In FIG. 8e, an electrically conductive layer or RDL 314 is formed over insulating layer 310 and conductive TSV 312 using a patterning and metal deposition process such as printing, PVD, CVD, sputtering, electrolytic plating, and electroless plating. Conductive layer 314 can be one or more layers of Al, Cu, Sn, Ni, Au, Ag, or other suitable electrically conductive material. Conductive layer 314 follows the contour of multi-stepped interposer 300. Conductive layer 314 provides an electrical path between flat portion 302 and flat portion 304 of the stepped interposer 300. One portion of conductive layer 314 is electrically connected to conductive TSV 312. Other portions of conductive layer 314 can be electrically common or electrically isolated depending on the design and function of the later mounted semiconductor die.

In FIG. 8f, semiconductor die 316, similar to FIGS. 3a-3c, has a back surface 318 and active surface 320 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 320 to implement analog circuits or digital circuits, such as DSP, ASIC, memory, or other signal processing circuit. Semiconductor die 316 may also contain IPDs, such as inductors, capacitors, and resistors, for RF signal processing. Contact pads 322 are formed over active surface 320 and bumps 324 are formed on the contact pads. In one embodiment, semiconductor die 316 is a flipchip type semiconductor die.

Semiconductor die 316 are mounted into recess 298 with active surface 320 oriented toward stepped interposer 300. Bumps 324 are metallurgically and electrically connected to conductive layer 314 over flat portion 302.

Semiconductor die 326, similar to FIGS. 3a-3c, has a back surface 328 and active surface 330 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 330 to implement analog circuits or digital circuits, such as DSP, ASIC, memory, or other signal processing circuit. Semiconductor die 326 may also contain IPDs, such as inductors, capacitors, and resistors, for RF signal processing. Contact pads 332 are formed over active surface 330 and bumps 334 are formed on the contact pads. In one embodiment, semiconductor die 326 is a flipchip type semiconductor die. Semiconductor die 326 are larger than semiconductor die 316.

Semiconductor die 326 are mounted over recess 298 with active surface 330 oriented toward stepped interposer 300. Bumps 334 are metallurgically and electrically connected to conductive layer 314 over flat portion 304.

Figure 8G:
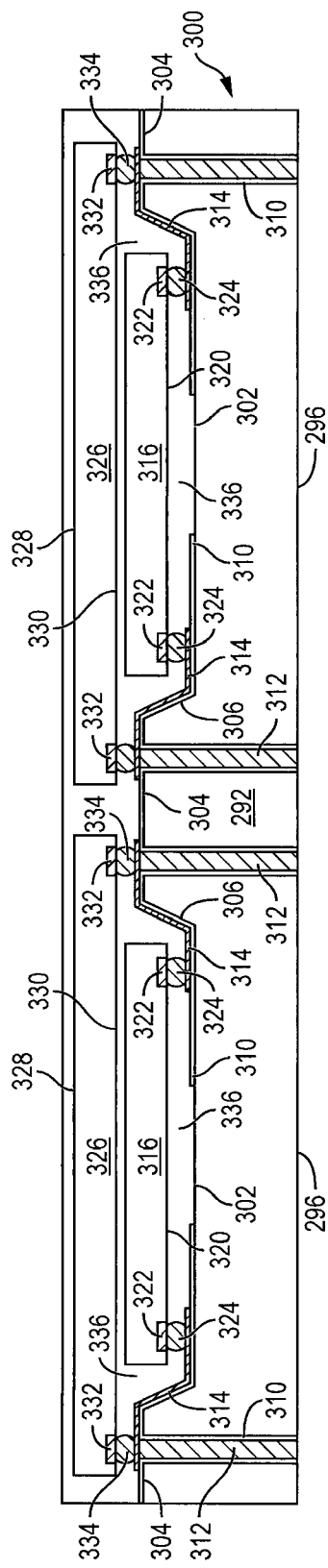

In FIG. 8g, an encapsulant or molding compound 336 is deposited over stepped interposer 300 and semiconductor die 316 and 326 using a paste printing, compressive molding, transfer molding, liquid encapsulant molding, vacuum lamination, spin coating, or other suitable applicator. Encapsulant 336 can be polymer composite material, such as epoxy resin with filler, epoxy acrylate with filler, or polymer with proper filler. Encapsulant 336 is non-conductive and environmentally protects the semiconductor device from external elements and contaminants.

Figure 8H:
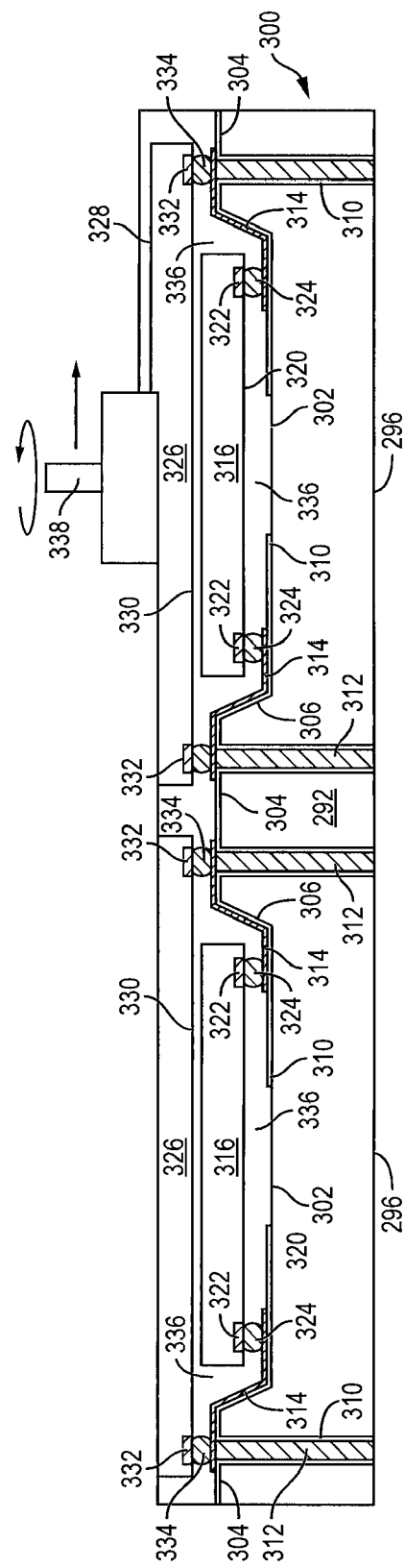

In FIG. 8h, back surface 328 of semiconductor die 326 and encapsulant 336 undergo a grinding operation with grinder 338 to planarize the surfaces and reduce the height of stepped interposer 300. In addition, bottom surface 296 can undergo a grinding operation with grinder 338 to further reduce the height of stepped interposer 300, as shown in FIG. 8i.

In FIG. 8j, an electrically conductive layer or RDL 340 is formed over bottom surface 296 using a patterning and metal deposition process such as printing, PVD, CVD, sputtering, electrolytic plating, and electroless plating. Conductive layer 340 can be one or more layers of Al, Cu, Sn, Ni, Au, Ag, or other suitable electrically conductive material. The portions of conductive layer 340 can be electrically common or electrically isolated depending on the design and function of semiconductor die 316 and 326.

An electrically conductive bump material is deposited over conductive TSV 312 and conductive layer 340 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 312 and conductive layer 340 using a suitable attachment or bonding process. In one embodiment, the bump material is reflowed by heating the material above its melting point to form spherical balls or bumps 342. In some applications, bumps 342 are reflowed a second time to improve electrical contact to conductive TSV 312 and conductive layer 340. The bumps can also be compression bonded to conductive TSV 312 and conductive layer 340. Bumps 342 represent one type of interconnect structure that can be formed over conductive TSV 312 and conductive layer 340. The interconnect structure can also use stud bump, micro bump, or other electrical interconnect.

Figure 9:
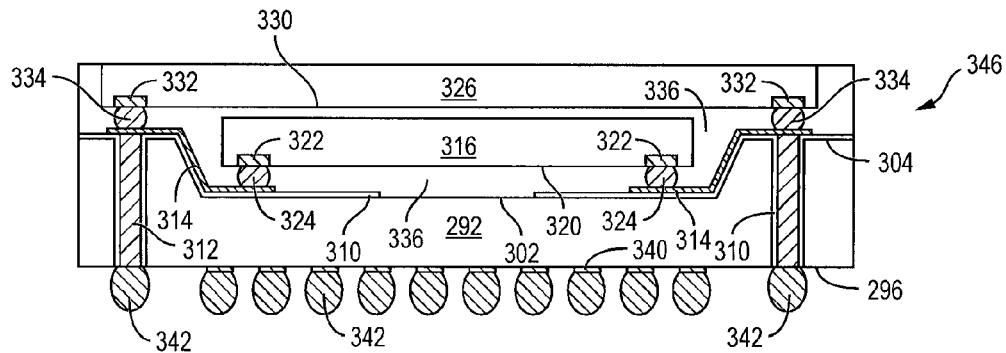
FIG. 9 illustrates the stacked die within the stepped interposer with conductive TSV after singulation.

Semiconductor die 316 and 326 are singulated through stepped interposer 300 with saw blade or laser cutting tool 344 into individual stacked die within and over the interposer, generally designated as 346. FIG. 9 shows stacked die 346 after singulation. Semiconductor die 316 is electrically connected through contact pads 322 and bumps 324 to conductive layer 314. Likewise, semiconductor die 326 is electrically connected through contact pads 332 and bumps 334 to conductive layer 314. Conductive layer 314 provides electrical connection between stacked semiconductor die 316 and 326, as well as electrical connection to external devices through conductive TSV 312 and bumps 342. Semiconductor die 316 is disposed within recess 298 to reduce the height of stacked die 346. The grinding operation further reduces the height of stacked die 346 without introducing warpage issues. The stepped interposer 300 provides for small bumps 324 and 334 and a fine interconnect pitch. The small size and fine pitch of bumps 324 and 334 increase I/O count and reduce bump collapse.

Figure 10:
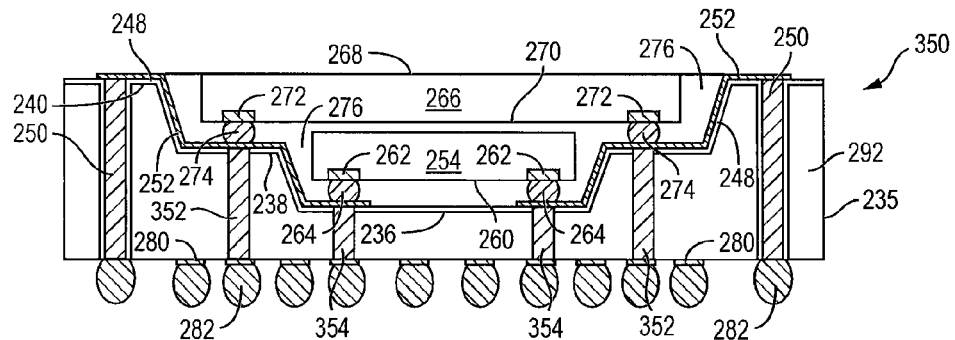
FIG. 10 illustrates the stacked die within the multi-stepped interposer and conductive TSV formed under the stacked die.

FIG. 10 shows an embodiment of stacked die 350, similar to FIG. 7, with additional conductive TSV formed through the semiconductor wafer. Prior to mounting semiconductor die 254 and 266, a plurality of vias is formed through multi-stepped interposer 235 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive TSV 352 and 354. Conductive TSV 352 is electrically connected between conductive layer 252 over flat portion 238 and conductive layer 280. Conductive TSV 354 is electrically connected between conductive layer 252 over flat portion 236 and conductive layer 280.

Figure 11:
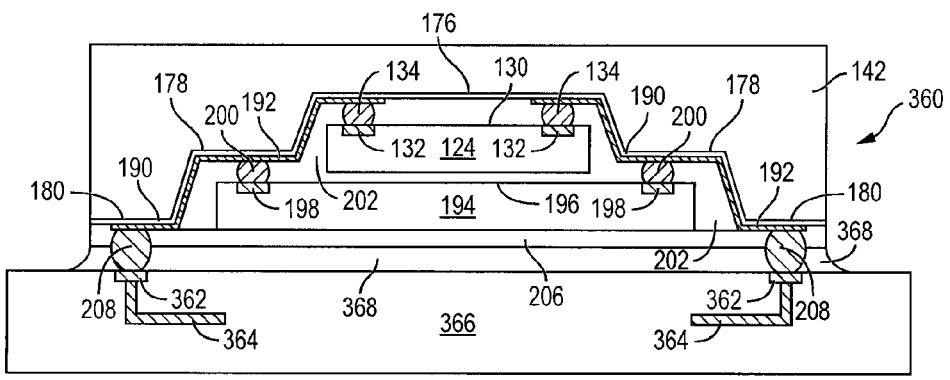
FIG. 11 illustrates the stacked die within the multi-stepped interposer mounted to a PCB.

FIG. 11 shows an embodiment of stacked die 360, similar to FIG. 5, with bumps 208 mounted to contact pads 362 and electrically connected to conductive traces 364 within PCB or substrate 366. An underfill material 368 is deposited between stacked die 360 and PCB 366 around bumps 208.

Figure 12:
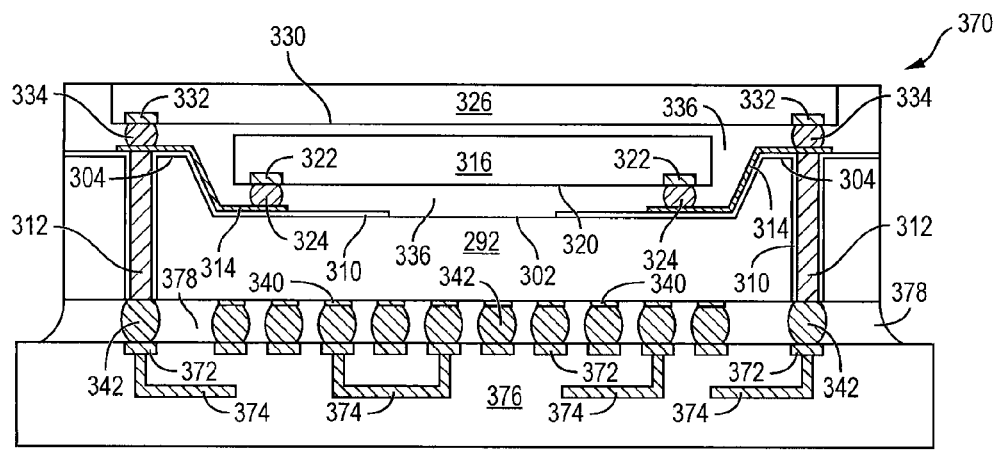
FIG. 12 illustrates the stacked die within the multi-stepped interposer with conductive TSV mounted to a PCB.

FIG. 12 shows an embodiment of stacked die 370, similar to FIG. 9, with bumps 342 mounted to contact pads 372 and electrically connected to conductive traces 374 within PCB or substrate 376. An underfill material 378 is deposited between stacked die 370 and PCB 376 around bumps 342.

Figure 13:
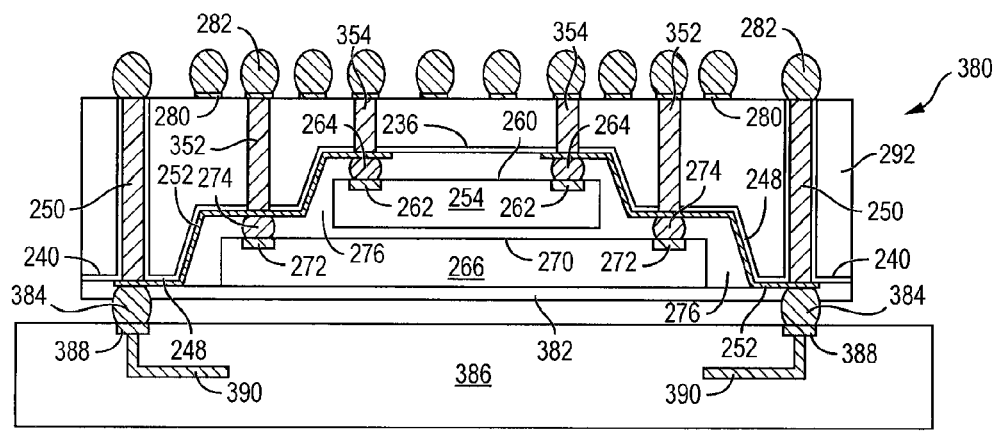
FIG. 13 illustrates the stacked die within the multi-stepped interposer with conductive TSV formed under the stacked die and mounted to a PCB.

FIG. 13 shows an embodiment of stacked die 380, similar to FIG. 10, with solder resist layer 382 deposited over back surface 268 and encapsulant 276. A portion of solder resist layer 382 is removed by an etching process to expose conductive layer 252 over flat portion 240. Bumps 384 are formed over the exposed conductive layer 252. Stacked die 380 is mounted to PCB or substrate 386 with bumps 384 metallurgically and electrically connected to contact pads 388 and conductive traces 390.

Figure 14:
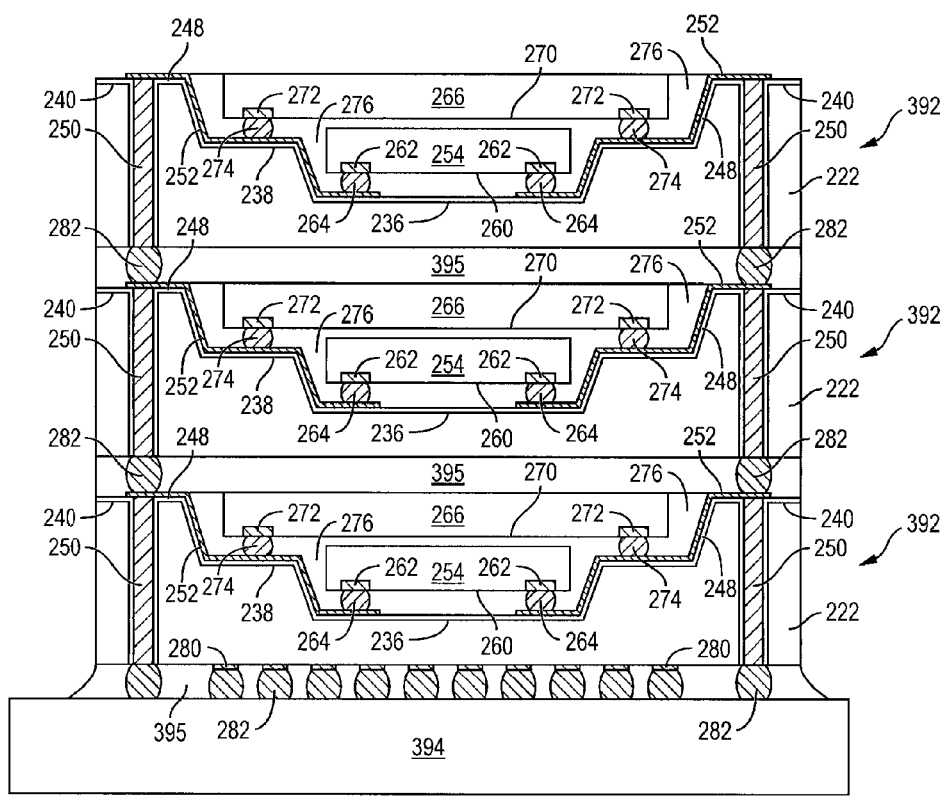
FIG. 14 illustrates the multiple sets of the stacked die within the multi-stepped interposer with conductive TSV stacked over to a PCB.

FIG. 14 shows an embodiment with a plurality of stacked die 392, each similar to FIG. 7, mounted to PCB or substrate 394. An underfill material 395 is deposited between each stacked die 392. The semiconductor die within each stacked die 392 is electrically connected through conductive layer 252, conductive TSV 250, and bumps 282.

Figure 15:
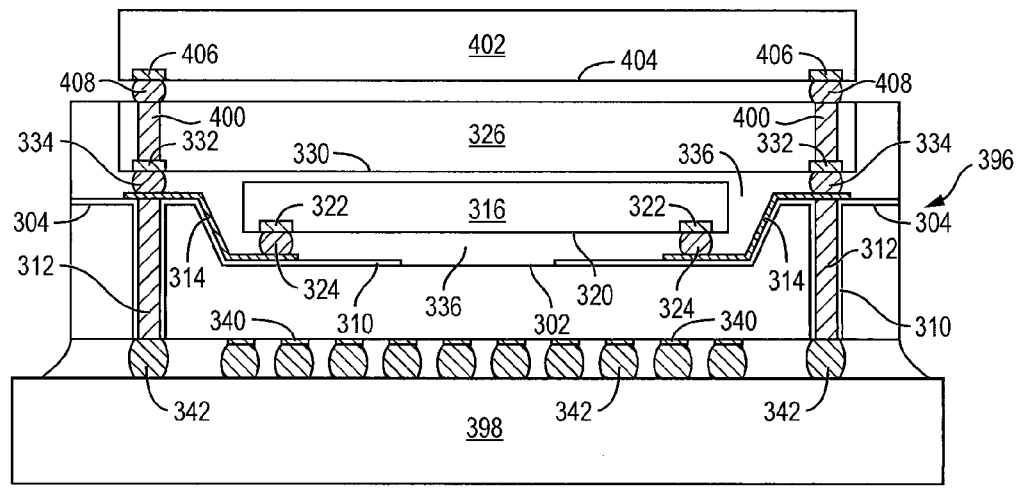
FIG. 15 illustrates a semiconductor die mounted to the stacked die with conductive TSV within the stepped interposer.

FIG. 15 shows an embodiment of stacked die 396, similar to FIG. 9, mounted to PCB or substrate 398. Conductive TSV 400 are formed through semiconductor die 326 and electrically connected to contact pads 322, bumps 324, conductive layer 314, and conductive TSV 312. Semiconductor die 402 has an active surface 404 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 404 to implement analog circuits or digital circuits, such as DSP, ASIC, memory, or other signal processing circuit. Semiconductor die 402 may also contain IPDs, such as inductors, capacitors, and resistors, for RF signal processing. Contact pads 406 are formed over active surface 402 and bumps 408 are formed on the contact pads. In one embodiment, semiconductor die 402 is a flipchip type semiconductor die.

Semiconductor die 402 is mounted to stacked die 396 with bumps 408 metallurgically and electrically connected to conductive TSV 400.

Figure 16:
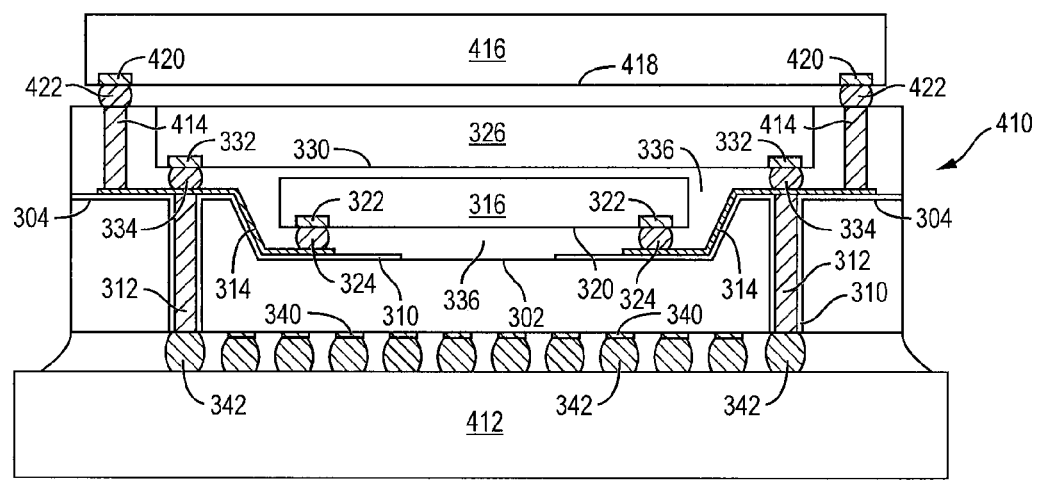
FIG. 16 illustrates a semiconductor die mounted to the stacked die within the stepped interposer with conductive TMV.

FIG. 16 shows an embodiment of stacked die 410, similar to FIG. 9, mounted to PCB or substrate 412. Conductive through mold vias (TMV) 414 are formed through encapsulant 336 and electrically connected to conductive layer 314 and conductive TSV 312. Semiconductor die 416 has an active surface 418 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 418 to implement analog circuits or digital circuits, such as DSP, ASIC, memory, or other signal processing circuit.

Semiconductor die 416 may also contain IPDs, such as inductors, capacitors, and resistors, for RF signal processing. Contact pads 420 are formed over active surface 418 and bumps 422 are formed on the contact pads. In one embodiment, semiconductor die 416 is a flipchip type semiconductor die.

Semiconductor die 416 is mounted to stacked die 410 with bumps 422 metallurgically and electrically connected to conductive TMV 414.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate;
   forming a recess in a first surface of the first substrate;
   forming an insulating layer over the first substrate;
   forming a conductive layer over the first surface of the first substrate including along a sidewall of the recess;
   disposing a first semiconductor die in the recess with a portion of the conductive layer extending under and electrically connected to the first semiconductor die; and
   disposing a second semiconductor die over the first semiconductor die and first surface of the first substrate and electrically connected to the conductive layer.

2. The method of claim 1, wherein the first or second semiconductor die includes a flipchip type semiconductor die.

3. The method of claim 1, further including removing a portion of the first substrate to reduce a thickness of the semiconductor device.

4. The method of claim 1, further including forming a conductive via through the first substrate.

5. The method of claim 4, further including:
   stacking a plurality of semiconductor devices; and
   electrically connecting the stacked semiconductor devices through the conductive via.

6. The method of claim 1, further including disposing the first substrate over a second substrate.

7. The method of claim 1, further including disposing a third semiconductor die over the second semiconductor die.

8. A method of making a semiconductor device, comprising:
   providing a substrate including a recess;
   forming a conductive layer following a contour of the recess;
   disposing a first semiconductor die in the recess with the conductive layer extending under the first semiconductor die; and
   disposing a second semiconductor die over the first semiconductor die with an active surface of the second semiconductor die oriented toward the substrate, wherein the second semiconductor die electrically connected to the conductive layer.

9. The method of claim 8, further including forming an insulating layer over the substrate prior to forming the conductive layer.

10. The method of claim 8, further including depositing an encapsulant over the first and second semiconductor die.

11. The method of claim 8, further including forming a conductive via through the substrate.

12. The method of claim 11, further including:
    stacking a plurality of semiconductor devices; and
    electrically connecting the stacked semiconductor devices through the conductive via.

13. The method of claim 8, further including disposing a third semiconductor die over the substrate.

14. The method of claim 8, further including removing a portion of the substrate to reduce thickness.

15. A semiconductor device, comprising:
a substrate;
a first recess formed through a first surface of the substrate;
a conductive layer formed over the first surface of the substrate including along a sidewall of the first recess;
a first semiconductor die disposed in the first recess with a portion of the conductive layer extending under the first semiconductor die;
a second semiconductor die disposed over the first semiconductor die and first surface of the substrate and electrically connected to the conductive layer; and
an encapsulant deposited over the first and second semiconductor die.

16. The semiconductor device of claim 15, further including an insulating layer formed over the substrate.

17. The semiconductor device of claim 15, further including a conductive via formed through the substrate.

18. The semiconductor device of claim 17, further including a plurality of stacked semiconductor devices electrically connected through the conductive via.

19. The semiconductor device of claim 15, wherein the first or second semiconductor die includes a flipchip type semiconductor die.

20. The semiconductor device of claim 15, further including a second recess formed in the substrate over the first recess, wherein the second semiconductor die is disposed in the second recess.

21. The semiconductor device of claim 20, wherein the conductive layer is formed along a sidewall of the second recess.

22. The semiconductor device of claim 15, wherein an active surface of the second semiconductor die is oriented toward the substrate.

23. A semiconductor device, comprising:
a substrate;
a first recess formed in a surface of the substrate;
a conductive layer formed over the substrate including along a sidewall of the first recess;
a first semiconductor die disposed in the first recess with a portion of the conductive layer extending under the first semiconductor die; and
a second semiconductor die disposed over the first semiconductor die and surface of the substrate and electrically connected to the conductive layer.

24. The semiconductor device of claim 23, wherein the first or second semiconductor die includes a flipchip type semiconductor die.

25. The semiconductor device of claim 23, further including a conductive via formed through the substrate.

26. The semiconductor device of claim 25, further including a plurality of stacked semiconductor devices electrically connected through the conductive via.

27. The semiconductor device of claim 23, wherein an active surface of the second semiconductor die is oriented toward the substrate.

28. The semiconductor device of claim 23, further including a third semiconductor die disposed over the substrate.

29. The semiconductor device of claim 23, further including a second recess formed in the substrate over the first recess, wherein the second semiconductor die is disposed in the second recess.

30. The semiconductor device of claim 29, wherein the conductive layer is formed along a sidewall of the second recess.

31. A semiconductor device, comprising:
a substrate including a first recess;
a conductive layer formed over the substrate including along a contour of the first recess;
a first semiconductor die disposed in the recess over the conductive layer; and
a second semiconductor die disposed over the first semiconductor die and electrically connected to the conductive layer, wherein an active surface of the second semiconductor die is oriented toward the substrate.

32. The semiconductor device of claim 31, further including an insulating layer formed over the substrate.

33. The semiconductor device of claim 31, wherein the first or second semiconductor die includes a flipchip type semiconductor die.

34. The semiconductor device of claim 31, further including a conductive via formed through the substrate.

35. The semiconductor device of claim 34, further including a plurality of stacked semiconductor devices electrically connected through the conductive via.

36. The semiconductor device of claim 31, further including a third semiconductor die disposed over the substrate.

37. The semiconductor device of claim 31, further including a second recess formed in the substrate, wherein the second semiconductor die is disposed in the second recess.

38. The semiconductor device of claim 37, wherein the conductive layer is formed along a sidewall of the second recess.

* * * * *